United States Patent
Tanigami

(10) Patent No.: US 6,589,844 B2
(45) Date of Patent: Jul. 8, 2003

(54) PROCESS FOR MANUFACTURING SEMICONDUCTOR MEMORY DEVICE HAVING FLOATING AND CONTROL GATES IN WHICH MULTIPLE INSULATING FILMS ARE FORMED OVER FLOATING GATES

(75) Inventor: Takuji Tanigami, Fukuyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/153,728

(22) Filed: May 24, 2002

(65) Prior Publication Data

US 2002/0173100 A1 Nov. 21, 2002

Related U.S. Application Data

(62) Division of application No. 09/588,761, filed on Jun. 6, 2000, now Pat. No. 6,441,430.

(30) Foreign Application Priority Data

Aug. 2, 1999 (JP) .......................................... 11-218971

(51) Int. Cl.⁷ ............................................. H01L 29/788
(52) U.S. Cl. ...................... 438/261; 438/257; 438/261; 438/264; 438/266; 438/424
(58) Field of Search ................................ 438/257, 261, 438/264, 266, 424

(56) References Cited

U.S. PATENT DOCUMENTS

| | | | |
|---|---|---|---|
| 4,822,750 A | 4/1989 | Perlegos et al. ............. | 438/264 |
| 5,559,048 A | 9/1996 | Inoue .......................... | 438/257 |
| 5,756,384 A | 5/1998 | Tseng .......................... | 438/257 |
| 5,796,140 A | 8/1998 | Tomioka ...................... | 257/316 |
| 5,892,258 A | 4/1999 | Kobatake ..................... | 257/316 |
| 5,953,602 A | 9/1999 | Oh et al. ...................... | 438/201 |
| 6,114,723 A | 9/2000 | Leu .............................. | 257/316 |
| 6,144,062 A | 11/2000 | Mine et al. .................. | 257/317 |
| 6,222,225 B1 | 4/2001 | Nakamura et al. .......... | 257/315 |
| 6,326,266 B1 | 12/2001 | Brambilla et al. .......... | 438/258 |
| 6,441,430 B1 | 8/2002 | Tanigami ..................... | 257/317 |

FOREIGN PATENT DOCUMENTS

| JP | 4-06-104451 | 4/1994 |
|---|---|---|
| JP | Hei 9 (1997)-102554 | 4/1997 |

*Primary Examiner*—Richard Elms
*Assistant Examiner*—Beth E. Owens
(74) *Attorney, Agent, or Firm*—Nixon & Vanderhye P.C.

(57) ABSTRACT

A process for manufacturing a semiconductor memory device comprises the steps of: (a) forming a tunnel oxide film, a first (1st) conductive film to be a lower floating gate, a 1st insulating film and a second (2nd) insulating film in this order on a semiconductor substrate and patterning the 2nd insulating film, the 1st insulating film, the 1st conductive film and the tunnel oxide film into a desired configuration; (b) forming a third (3rd) insulating film on the entire surface of the resulting substrate; (c) reducing the 3rd insulating film until the 2nd insulating film is exposed; (d) removing the 2nd insulating film; (e) removing the 1st insulating film while further reducing the 3rd insulating film; (f) forming a 2nd conductive film to be an upper floating gate on the 1st conductive film and the 3rd insulating film; (g) flattening the 2nd conductive film until the 3rd insulating film is exposed; and (h) forming an interlayer capacitance film and a 3rd conductive film to be a control gate on the 2nd conductive film and the 3rd insulating film, and patterning the 3rd conductive film, the interlayer capacitance film, the 2nd conductive film and the 1st conductive film to form a floating gate and the control gate.

11 Claims, 31 Drawing Sheets

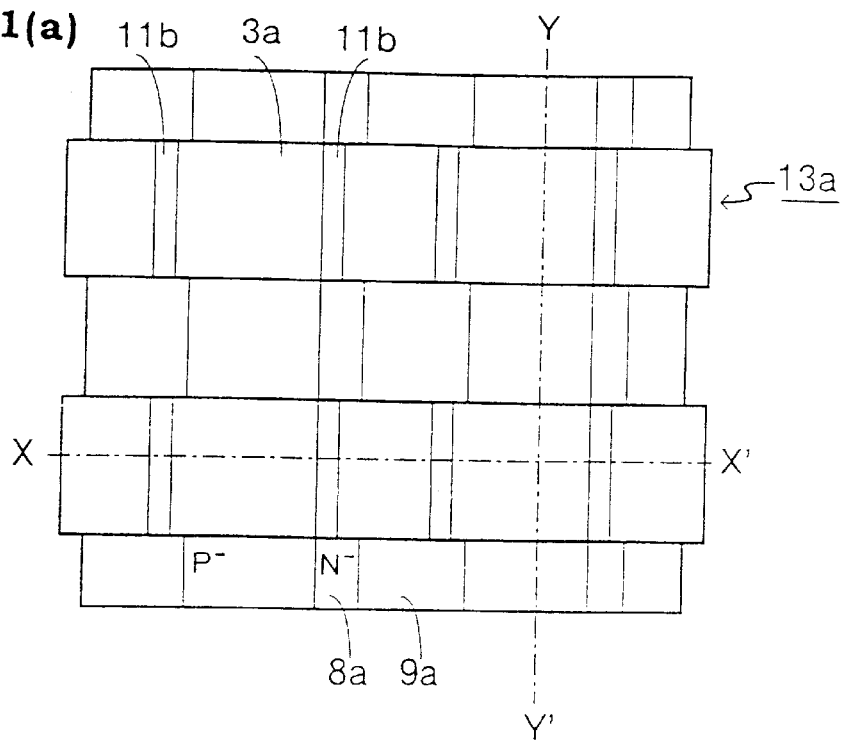
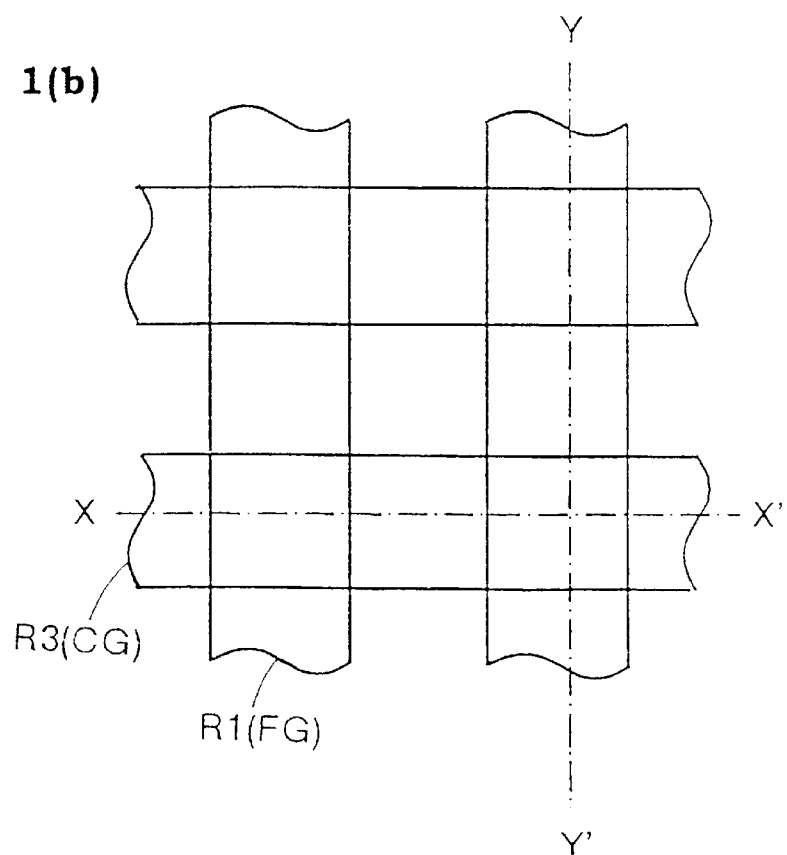

Fig. 2(a') 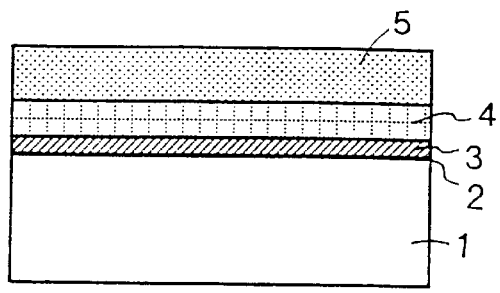

Fig. 2(b') 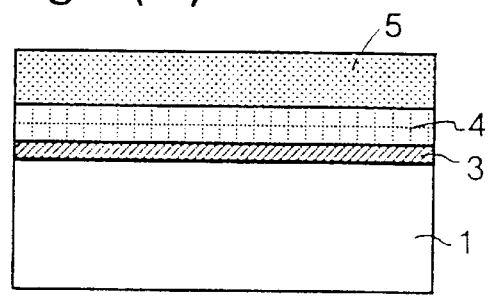

Fig. 2(c') 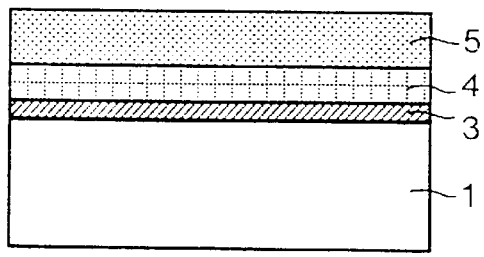

Fig. 2(d') 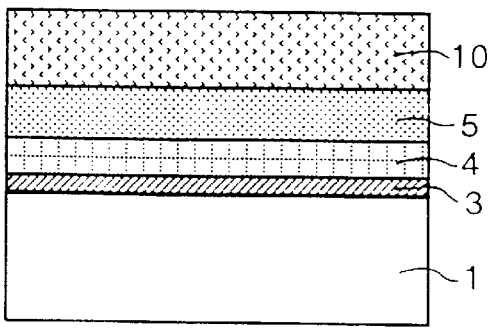

Fig. 2(e') 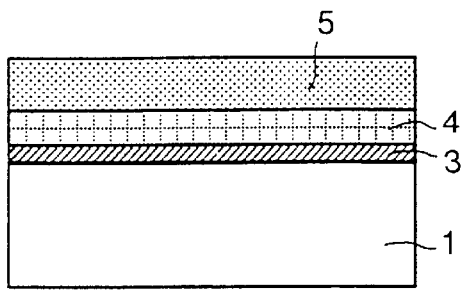

Fig. 2(f') 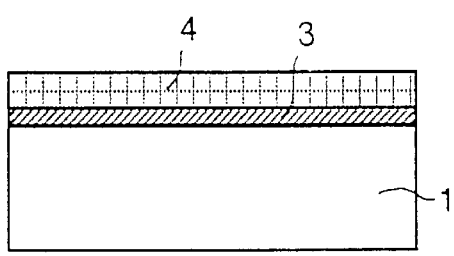

Fig. 2(g') 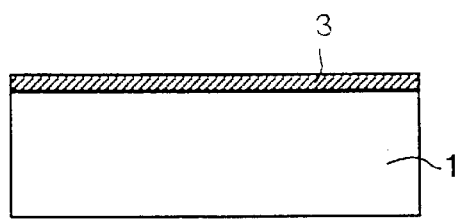

Fig. 2(h') 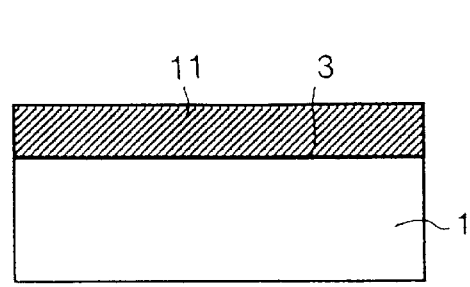

Fig. 2(i)
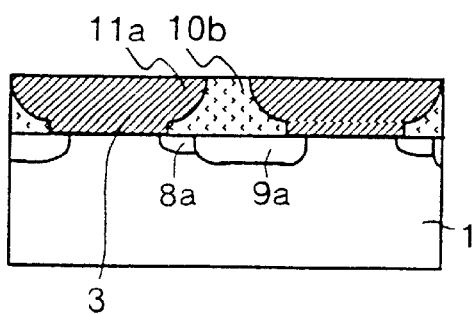
Fig. 2(i')
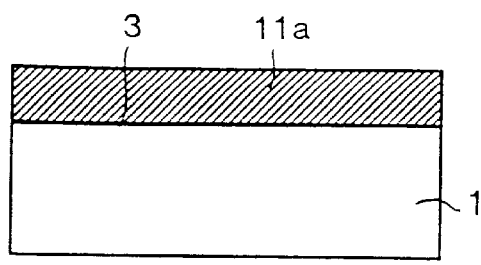
Fig. 2(j)
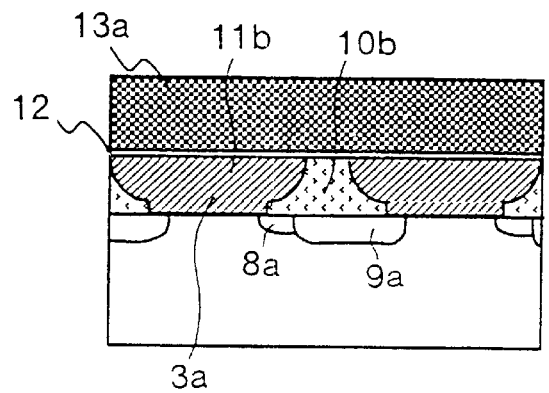
Fig. 2(j')
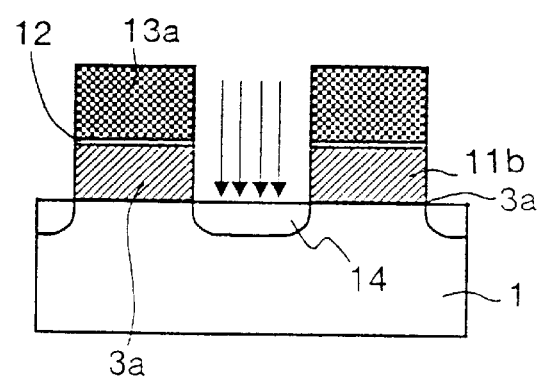

Fig. 4(a)
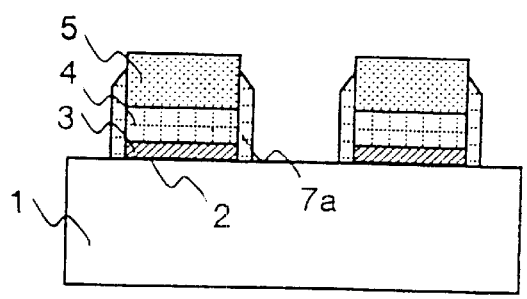
Fig. 4(a')
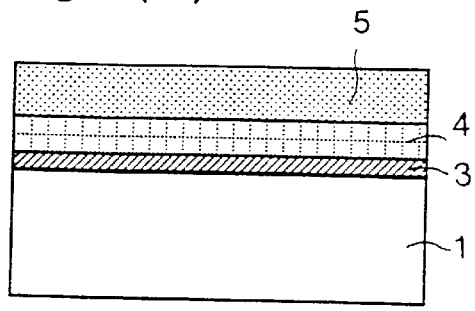
Fig. 4(b)
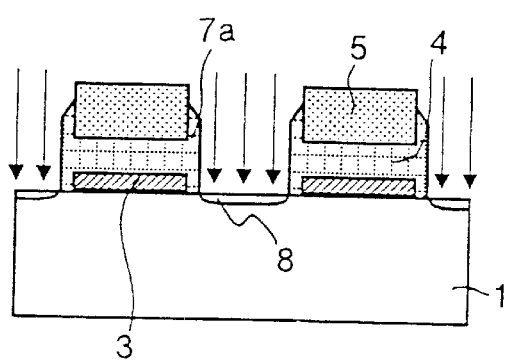
Fig. 4(b')
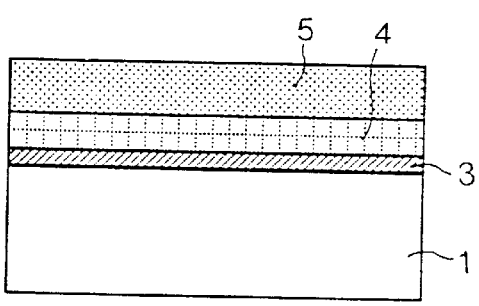
Fig. 4(c)
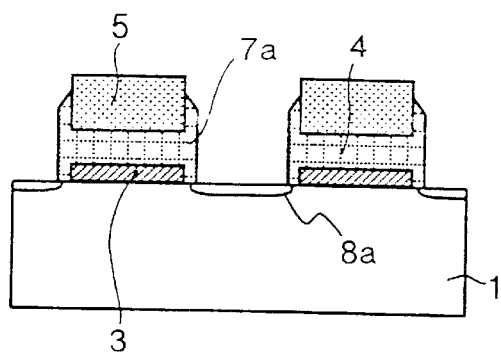
Fig. 4(c')
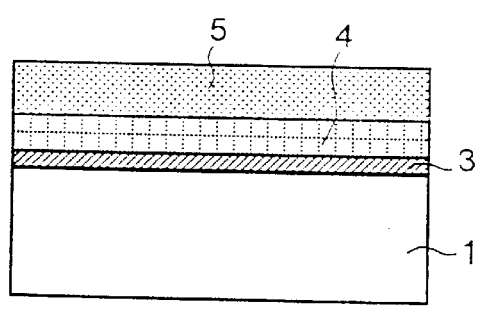
Fig. 4(d)
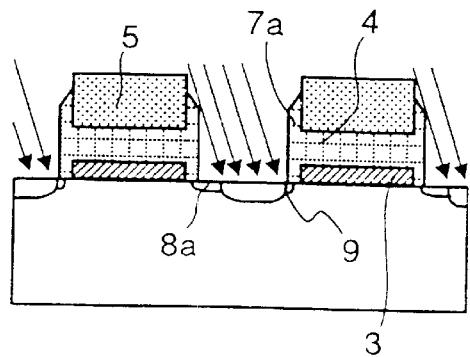
Fig. 4(d')
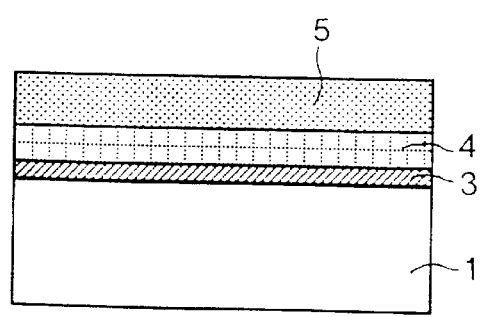

Fig. 4(e) 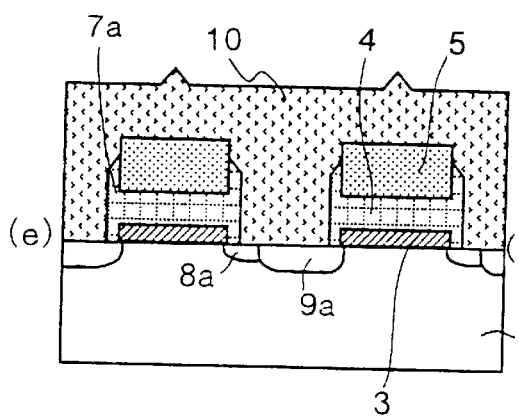 Fig. 4(e') 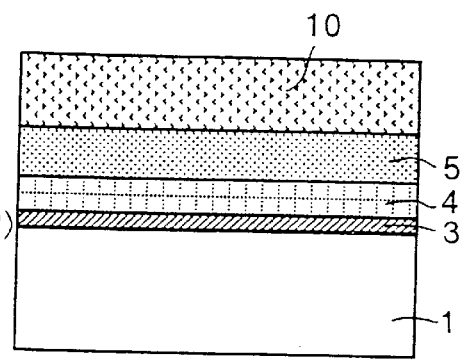
Fig. 4(f) 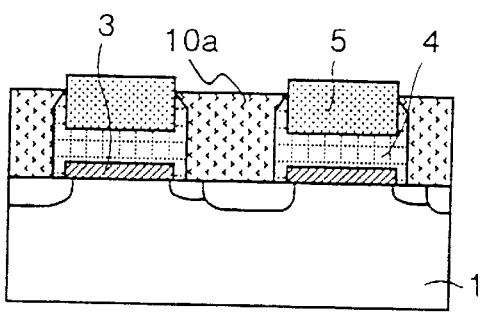 Fig. 4(f') 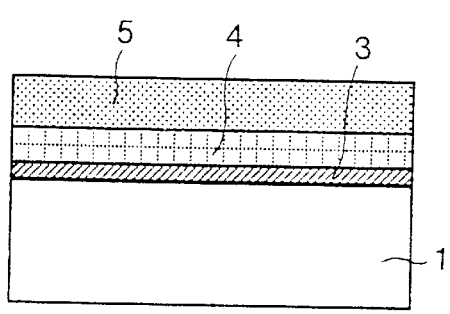
Fig. 4(g) 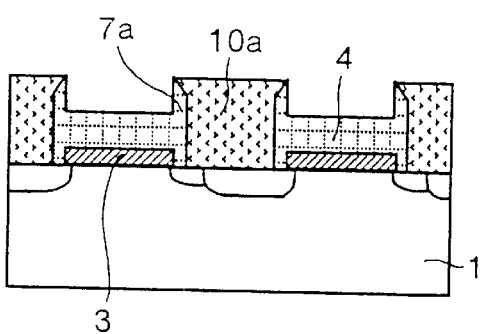 Fig. 4(g') 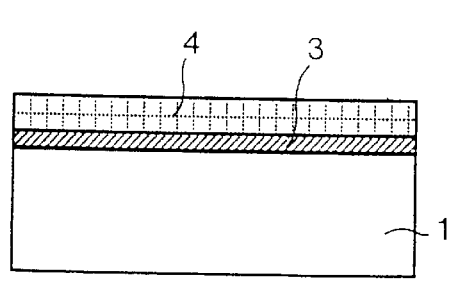
Fig. 4(h) 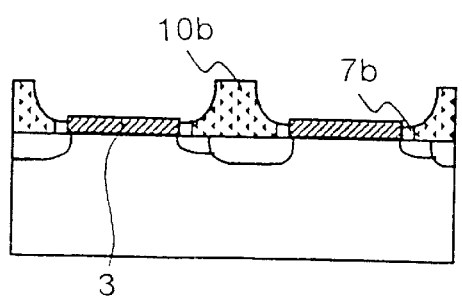 Fig. 4(h') 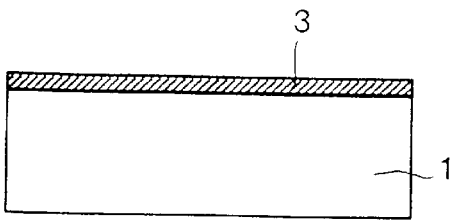

Fig. 4(i)
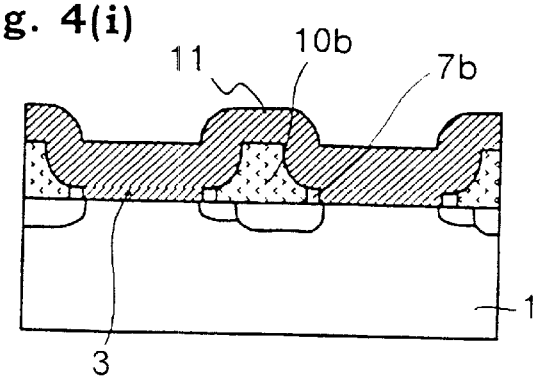
Fig. 4(i')
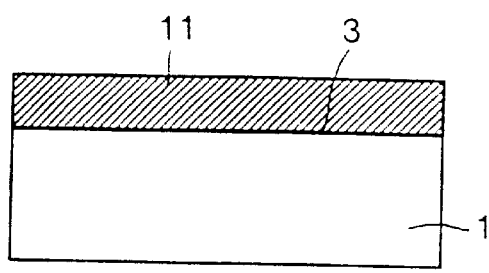
Fig. 4(j)
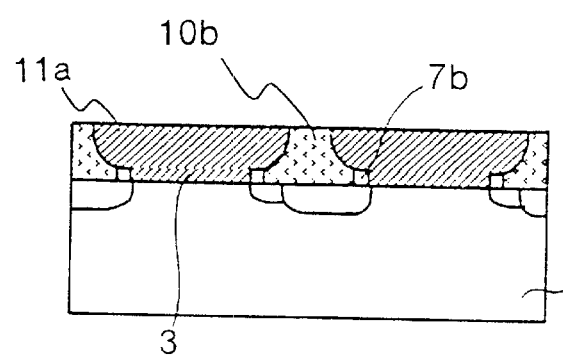
Fig. 4(j')
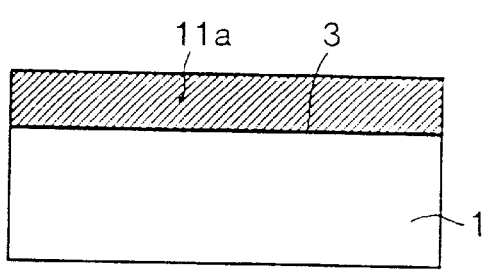
Fig. 4(k)
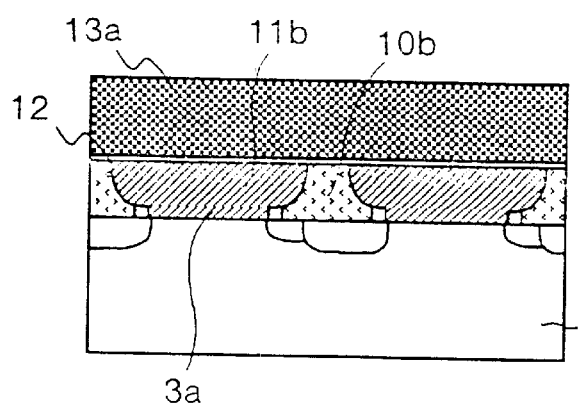
Fig. 4(k')
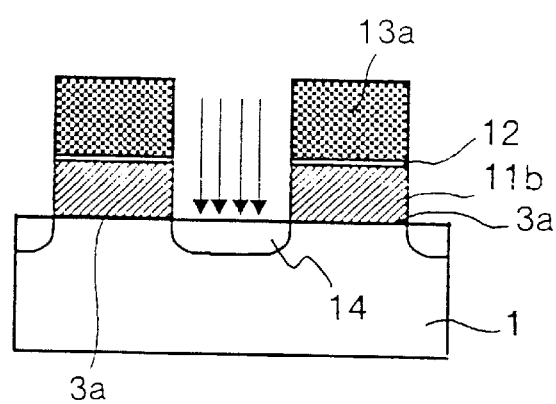

Fig. 5(a)
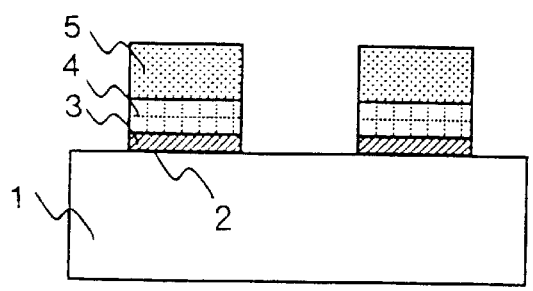
Fig. 5(a')
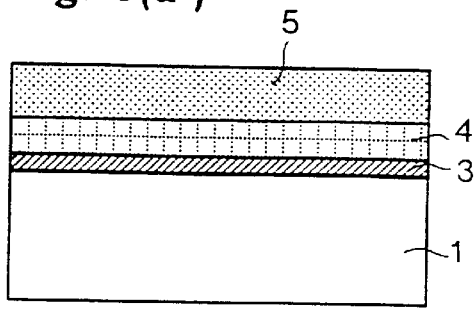
Fig. 5(b)
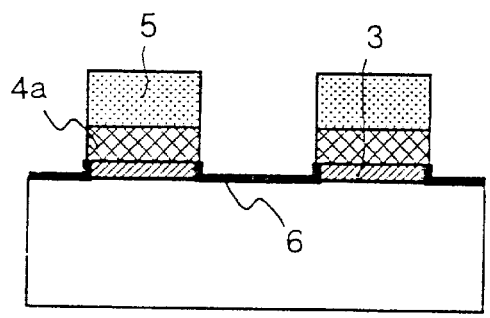
Fig. 5(b')
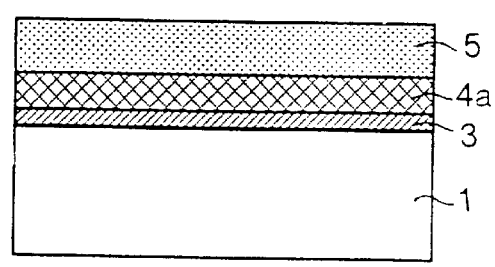
Fig. 5(c)
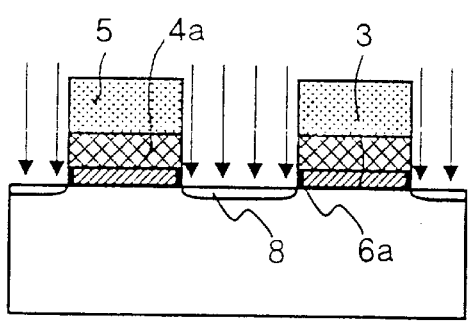
Fig. 5(c')
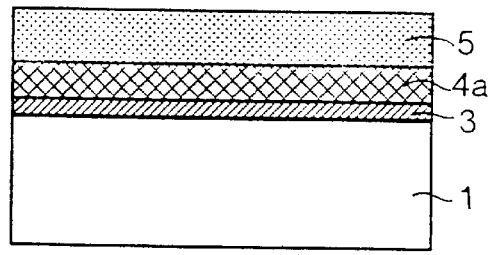
Fig. 5(d)
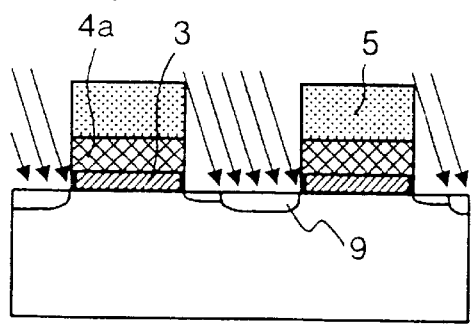
Fig. 5(d')
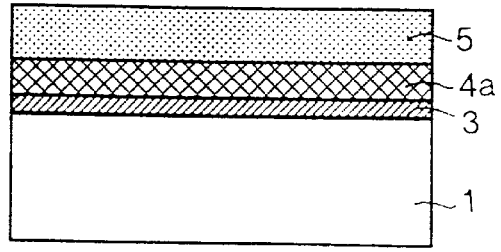

Fig. 5(e)
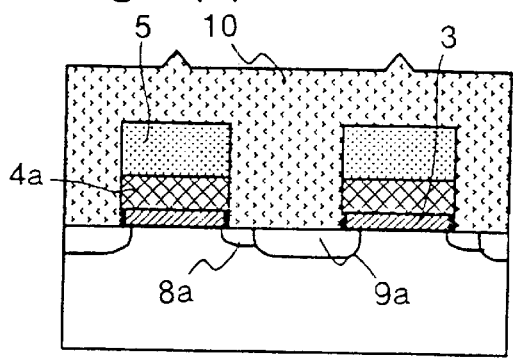
Fig. 5(e')
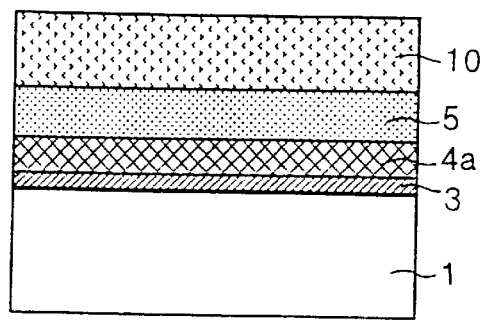
Fig. 5(f)
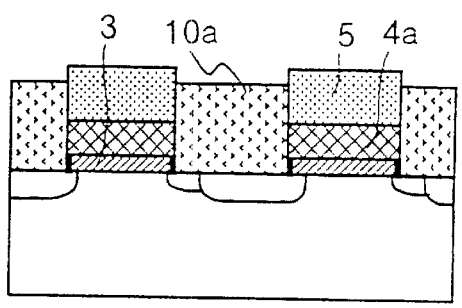
Fig. 5(f')
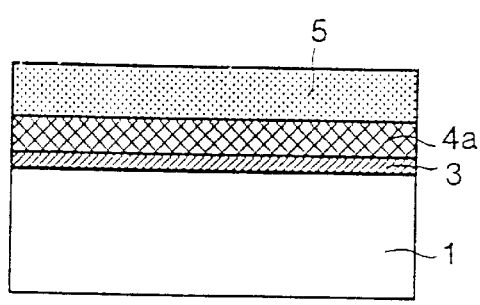
Fig. 5(g)
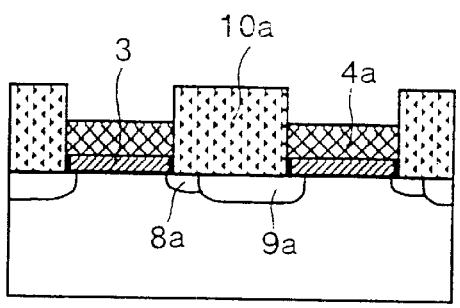
Fig. 5(g')
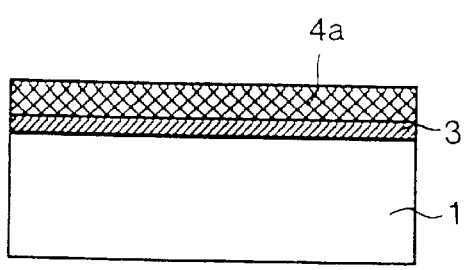
Fig. 5(h)
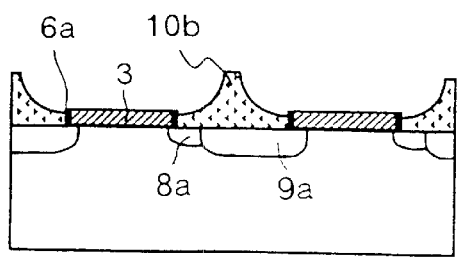
Fig. 5(h')
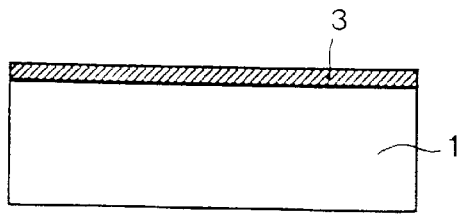

Fig. 5(i)
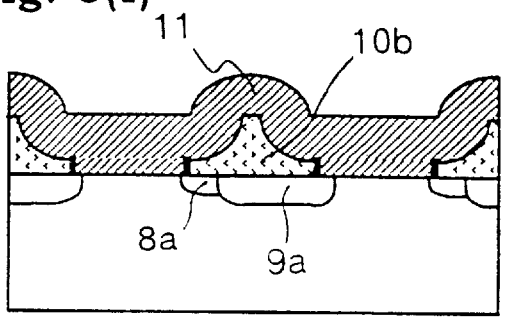
Fig. 5(i')
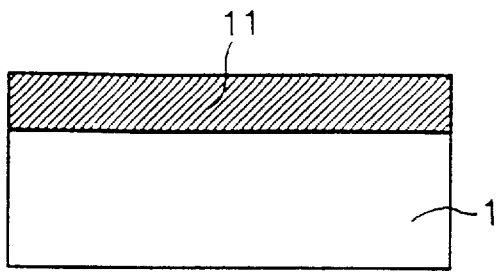
Fig. 5(j)
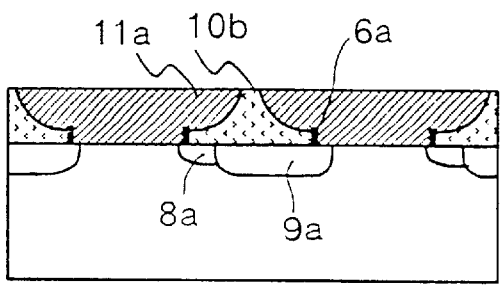
Fig. 5(j')
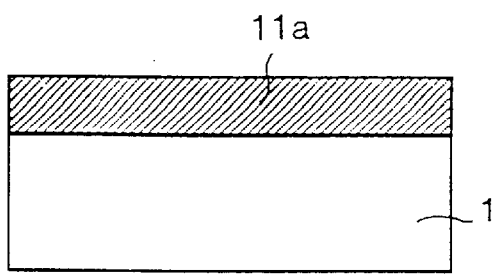
Fig. 5(k)
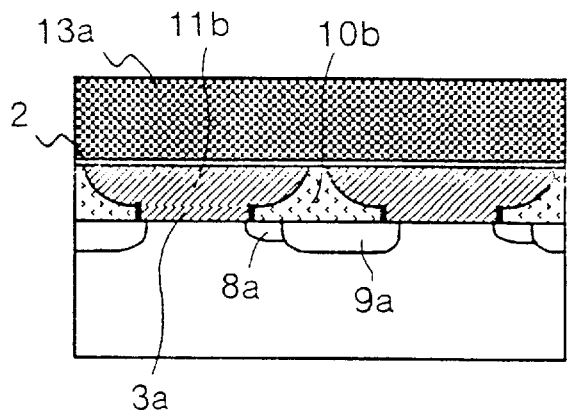
Fig. 5(k')
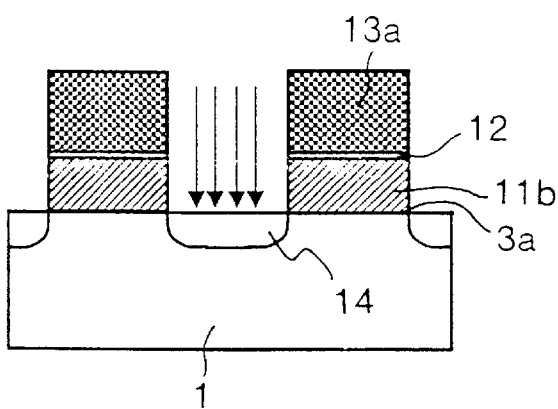

Fig. 6(a)
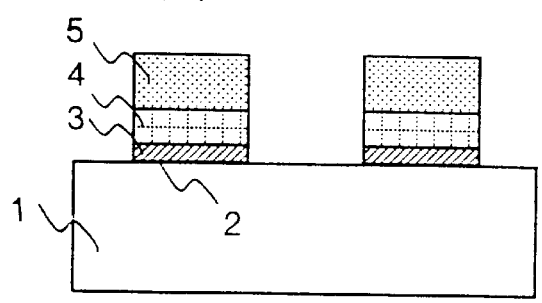
Fig. 6(a')
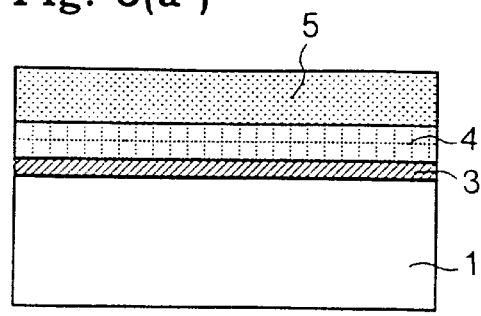
Fig. 6(b)
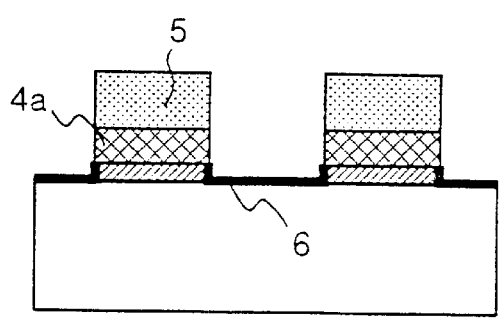
Fig. 6(b')
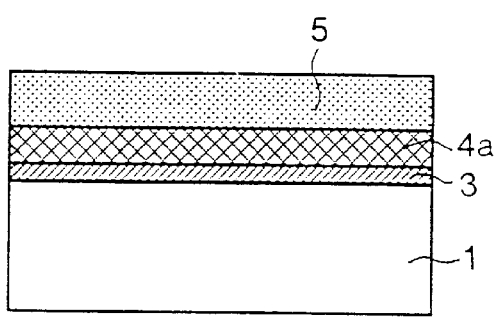
Fig. 6(c)
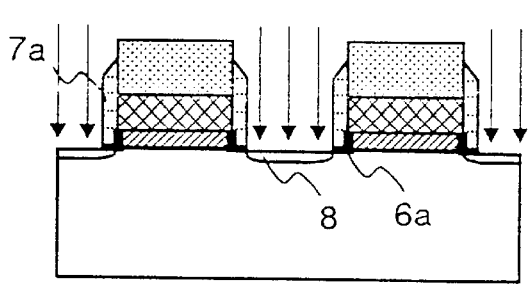
Fig. 6(c')
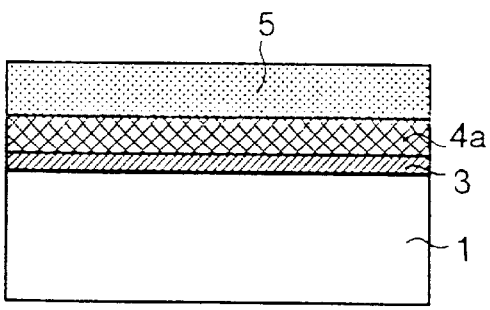
Fig. 6(d)
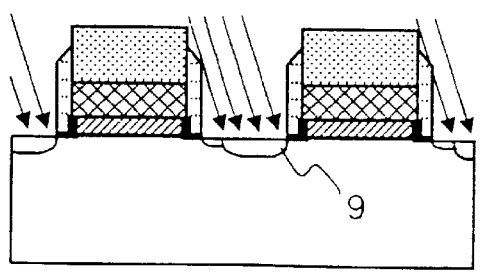
Fig. 6(d')
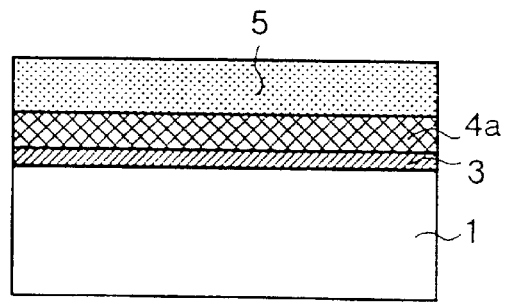

Fig. 6(e)
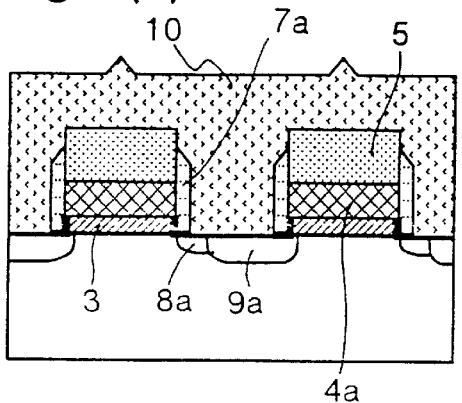
Fig. 6(e')
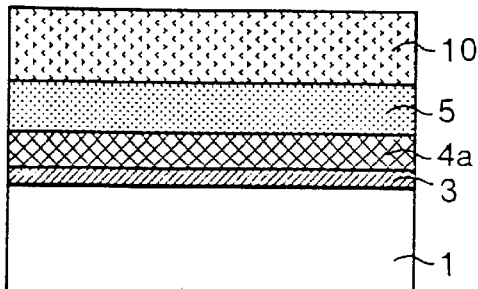
Fig. 6(f)
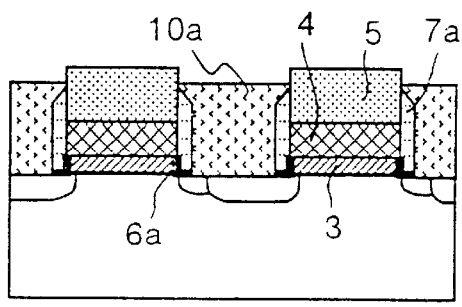
Fig. 6(f')
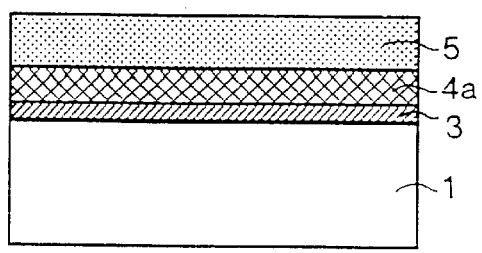
Fig. 6(g)
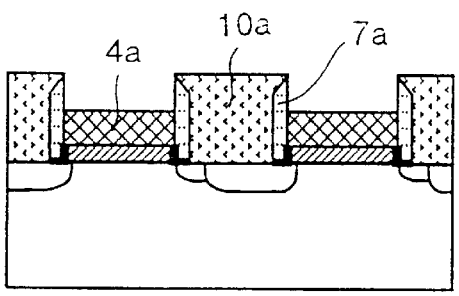
Fig. 6(g')
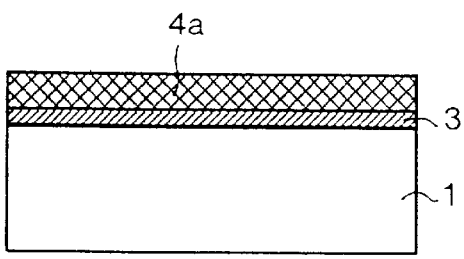
Fig. 6(h)
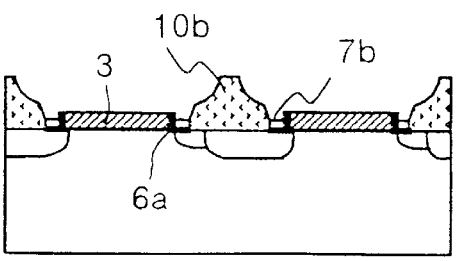
Fig. 6(h')
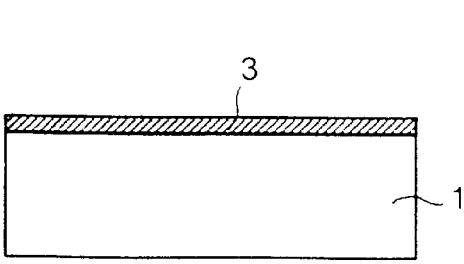

Fig. 6(i) 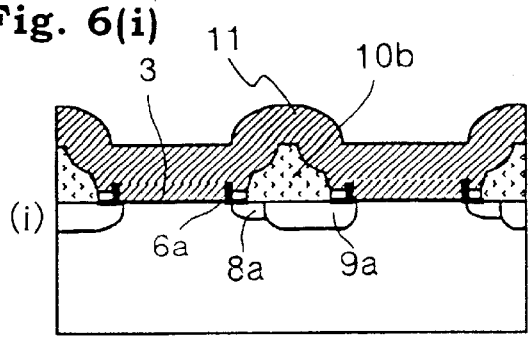 Fig. 6(i') 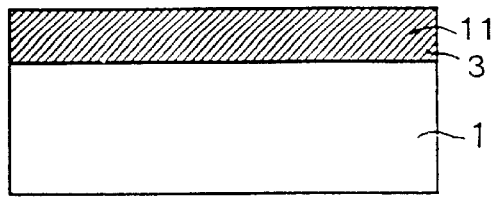
Fig. 6(j) 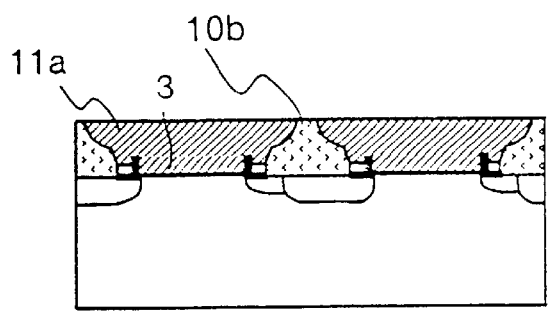 Fig. 6(j') 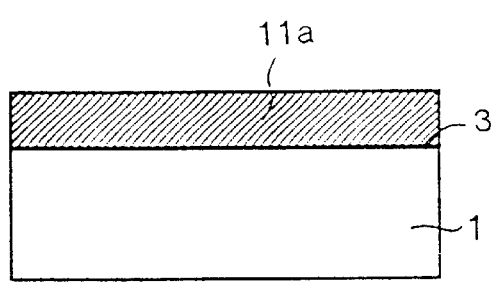
Fig. 6(k) 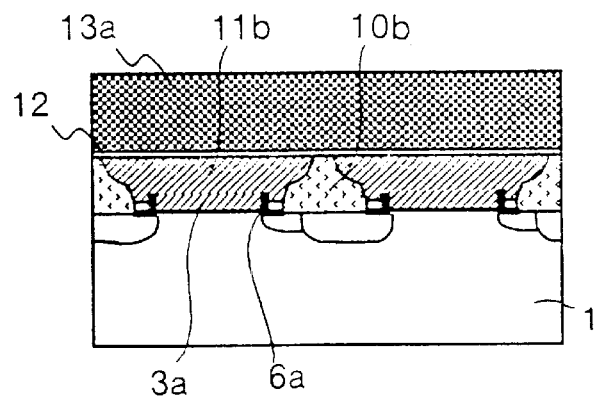 Fig. 6(k') 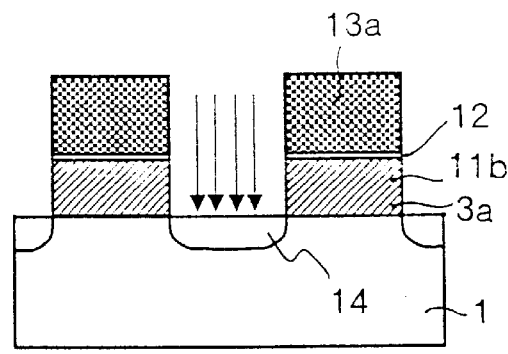

Fig. 7(a)
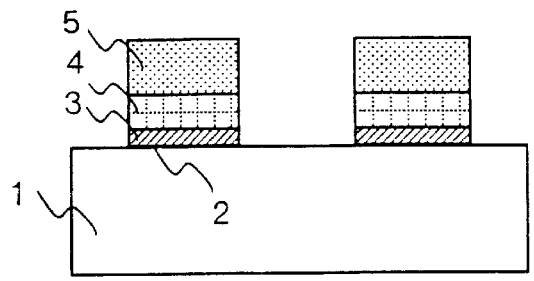
Fig. 7(a')
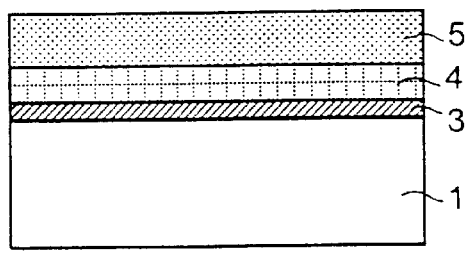
Fig. 7(b)
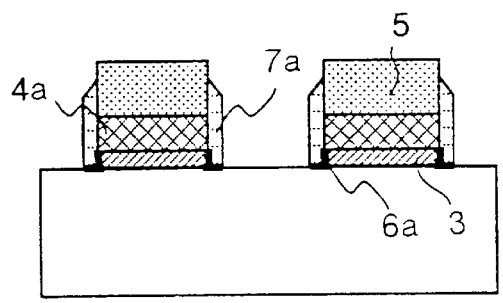
Fig. 7(b')
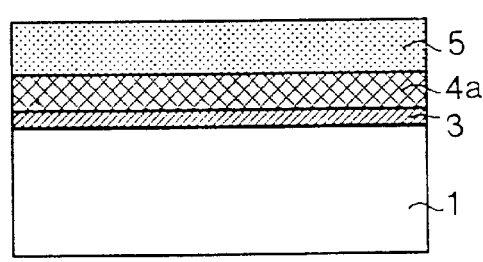
Fig. 7(c)
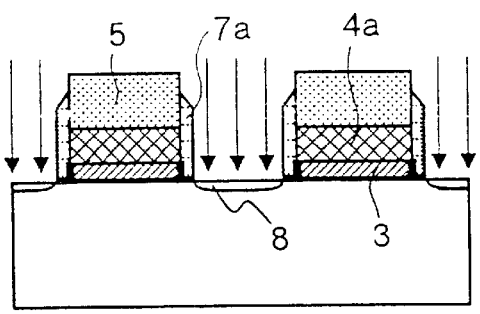
Fig. 7(c')
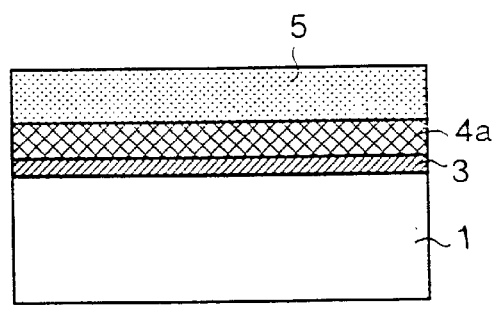
Fig. 7(d)
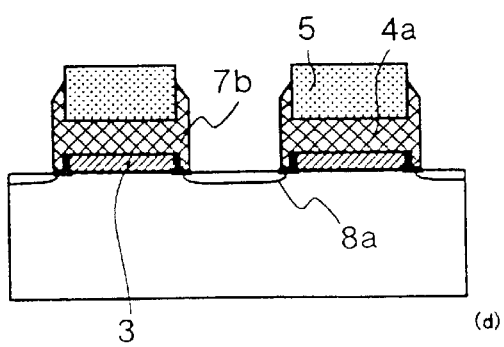
Fig. 7(d')
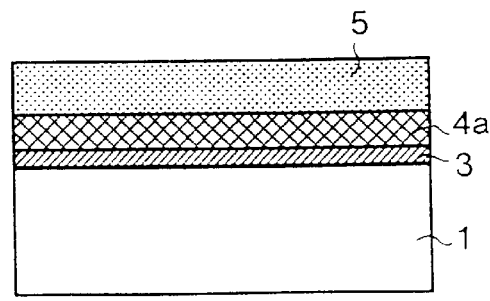

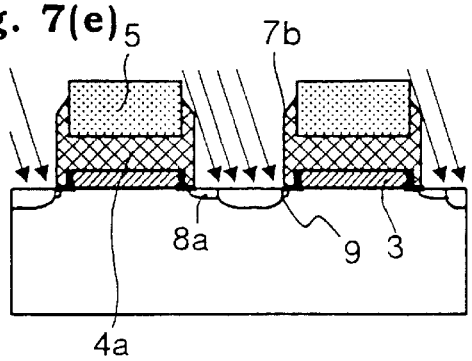
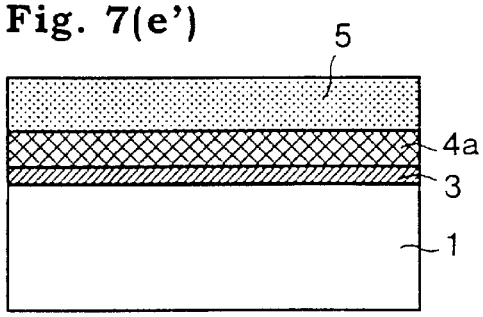
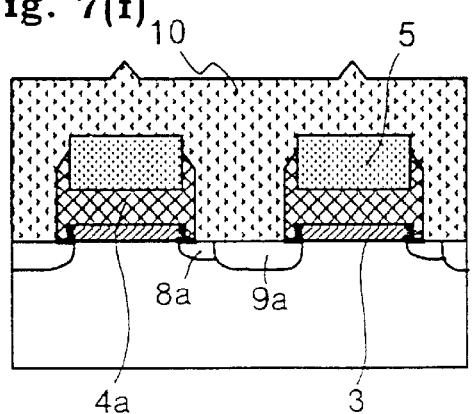
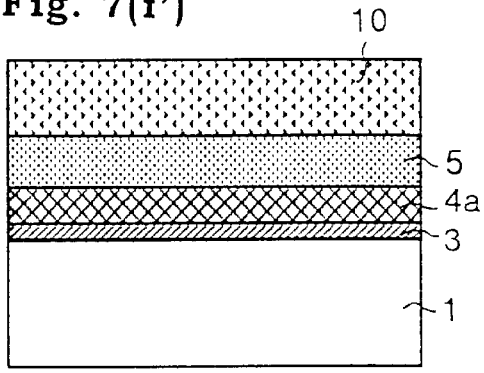
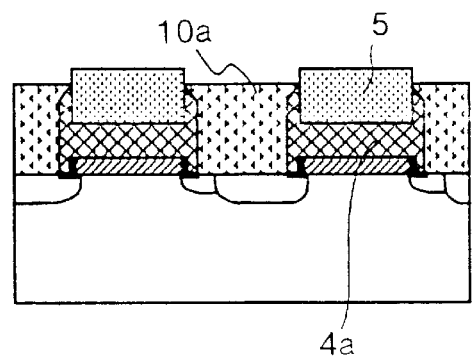
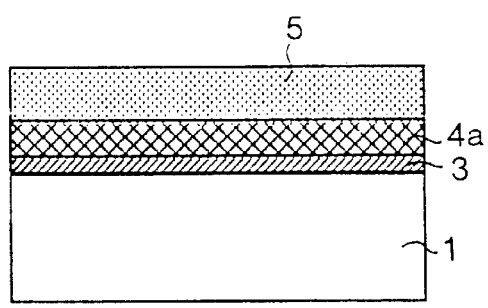
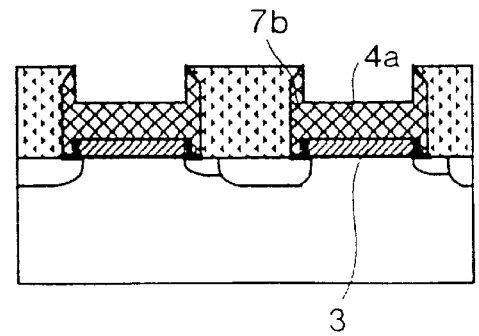
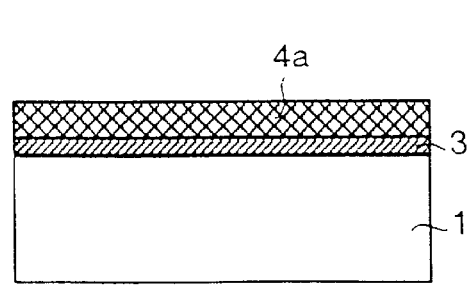

Fig. 7(i)
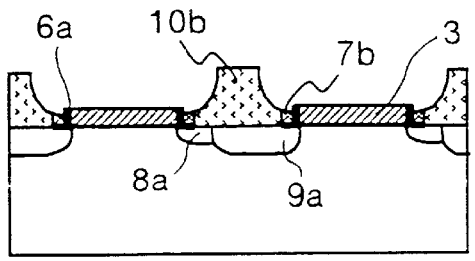
Fig. 7(i')
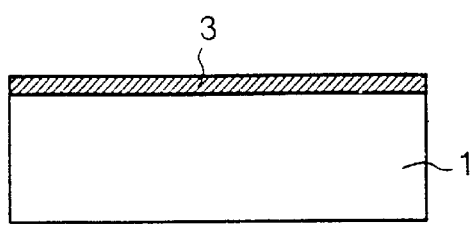
Fig. 7(j)
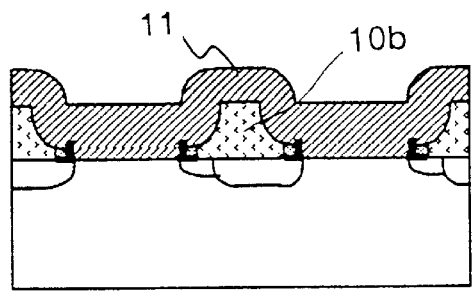
Fig. 7(j')
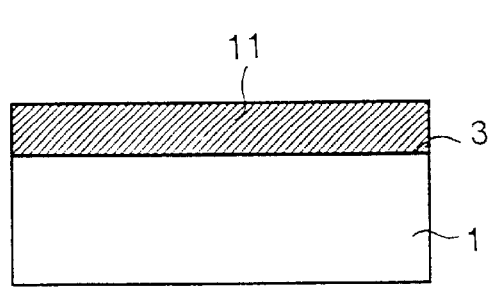
Fig. 7(k)
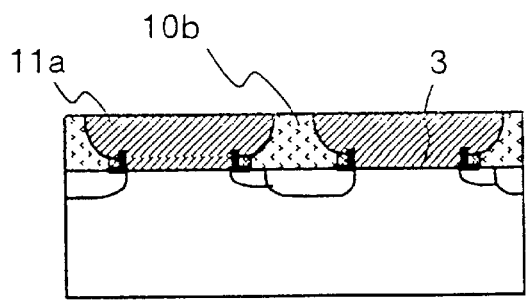
Fig. 7(k')
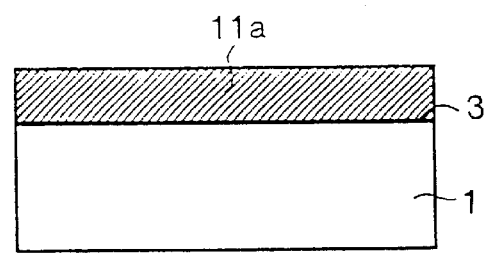
Fig. 7(l)
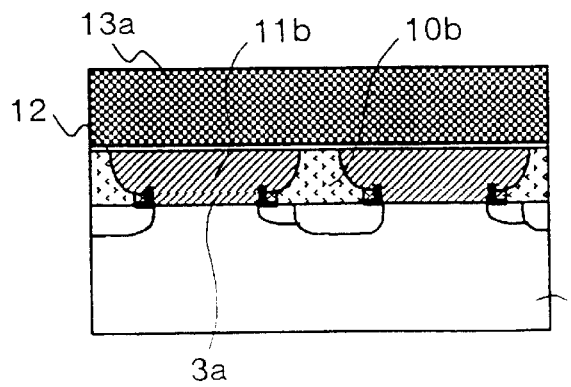
Fig. 7(l')
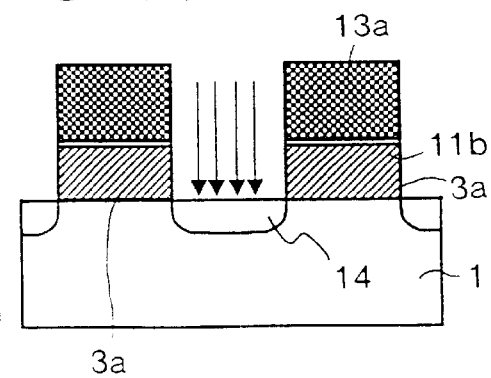

Fig. 9(a)
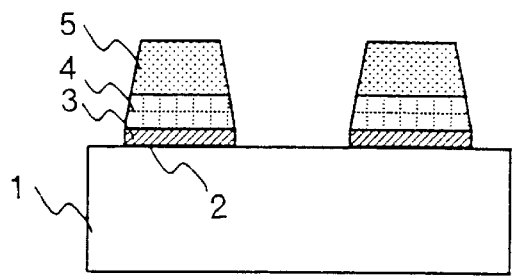
Fig. 9(a')
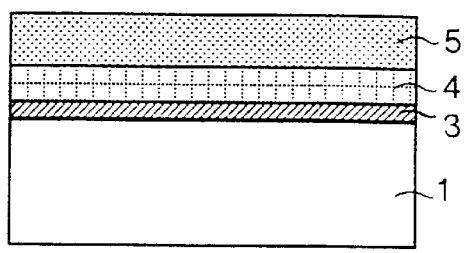
Fig. 9(b)
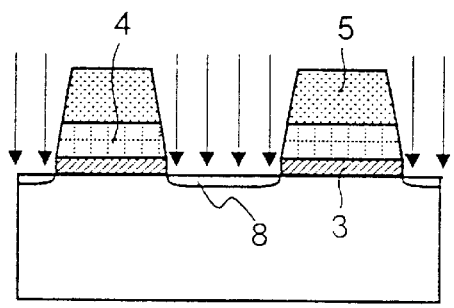
Fig. 9(b')
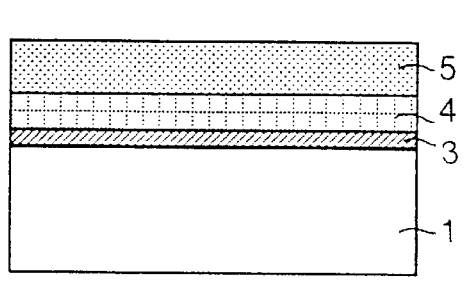
Fig. 9(c)
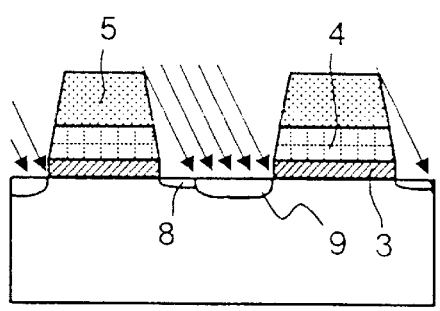
Fig. 9(c')
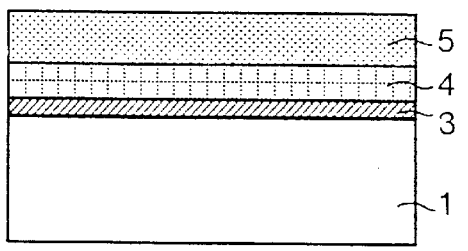
Fig. 9(d)
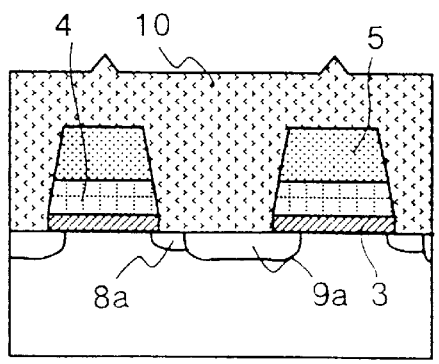
Fig. 9(d')
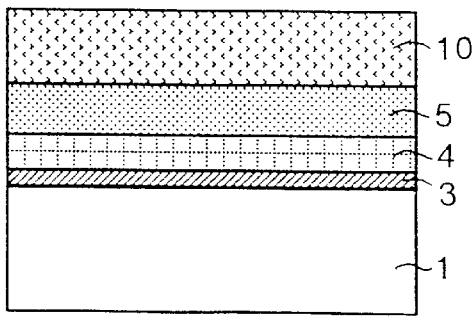

Fig. 9(e)
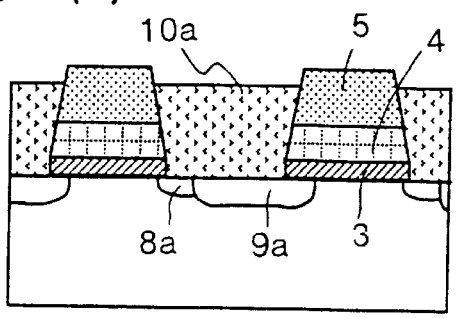
Fig. 9(e')
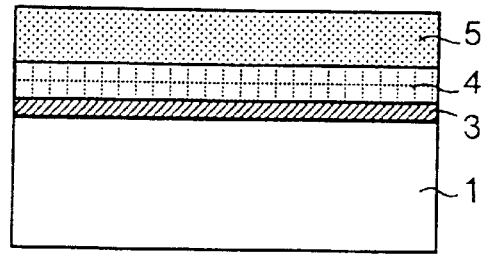
Fig. 9(f)
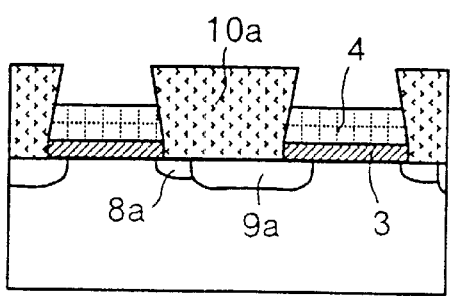
Fig. 9(f')
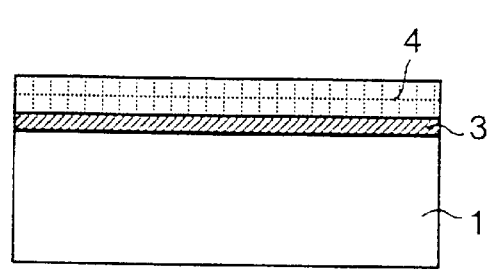
Fig. 9(g)
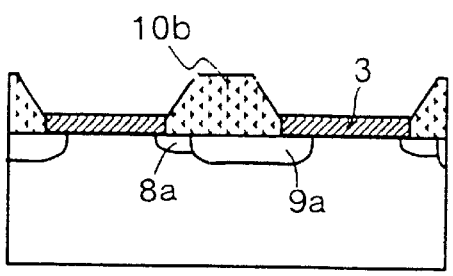
Fig. 9(g')
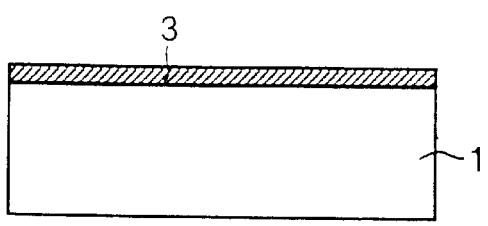
Fig. 9(h)
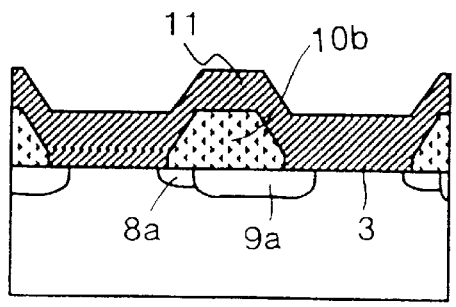
Fig. 9(h')
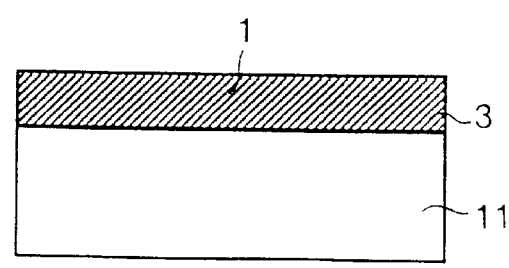

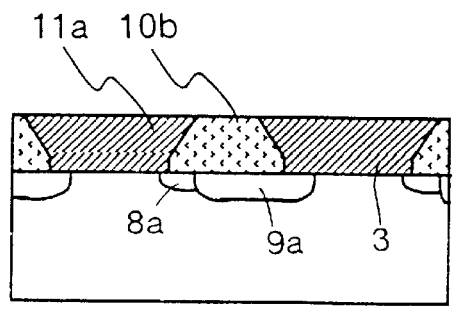
Fig. 9(i)
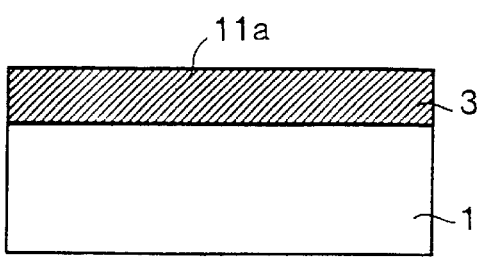
Fig. 9(i')
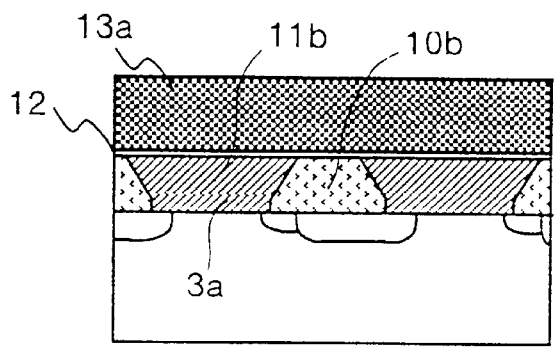
Fig. 9(j)
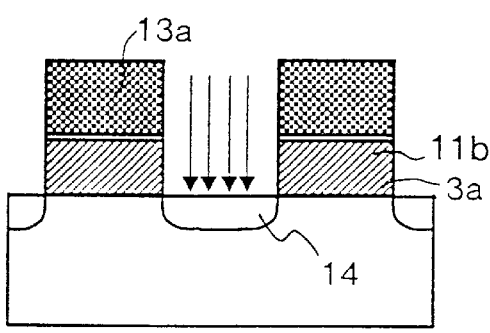
Fig. 9(j')
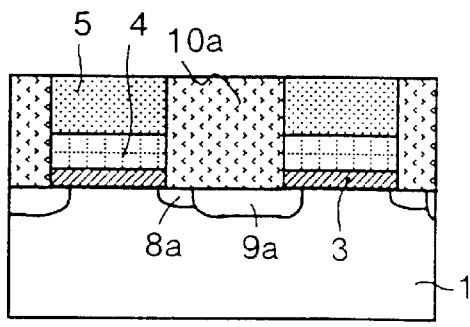
Fig. 10(a)
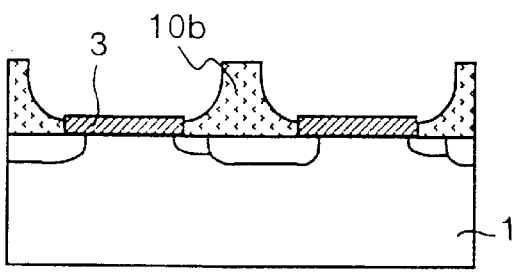
Fig. 10(b)

Fig. 11(a)
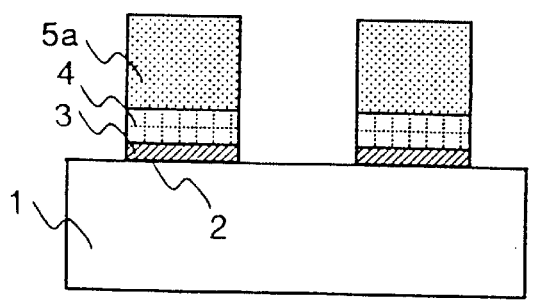
Fig. 11(a')
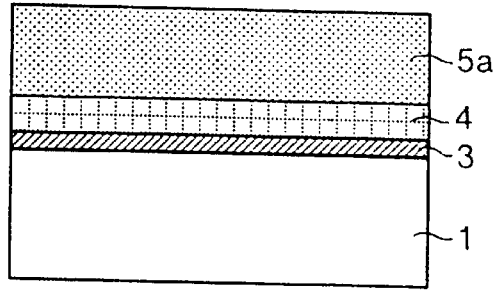
Fig. 11(b)
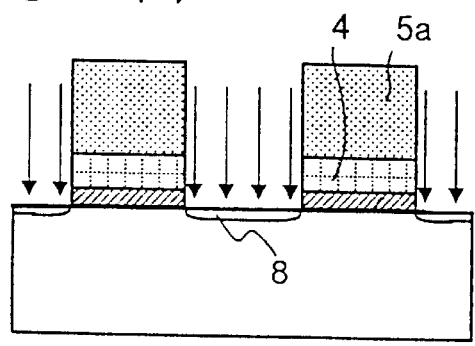
Fig. 11(b')
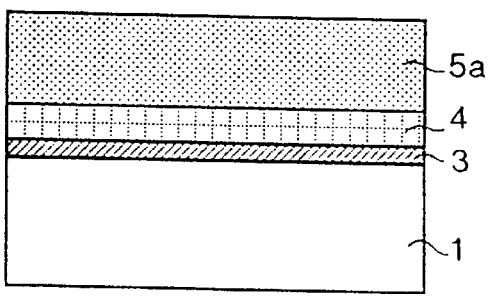
Fig. 11(c)
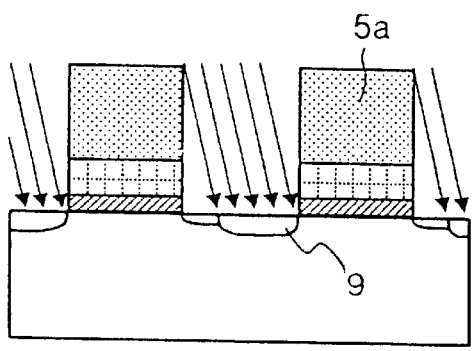
Fig. 11(c')
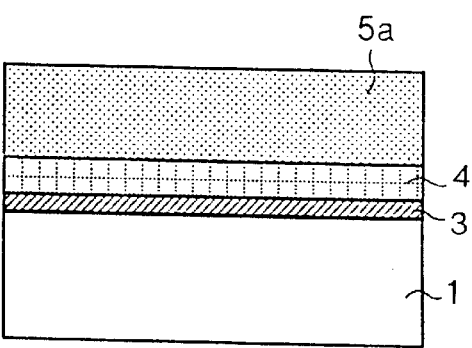
Fig. 11(d)
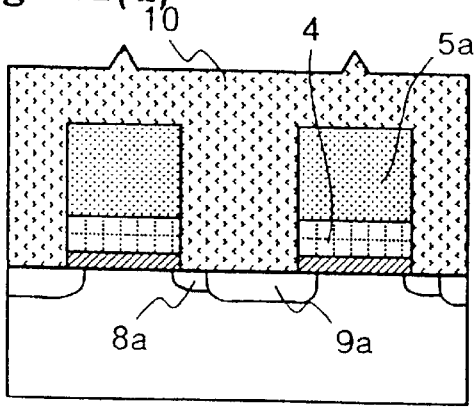
Fig. 11(d')
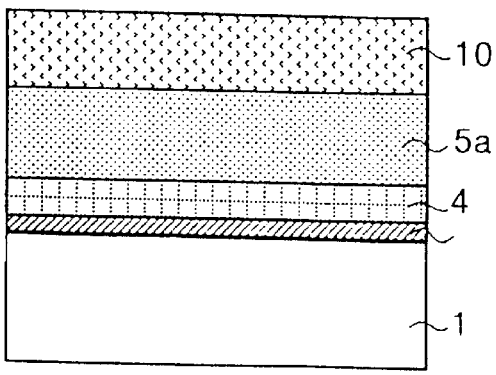

Fig. 11(e) 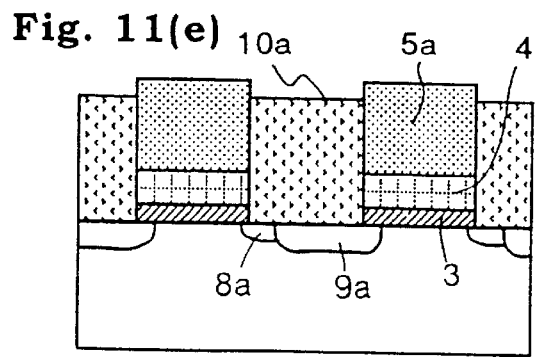 Fig. 11(e') 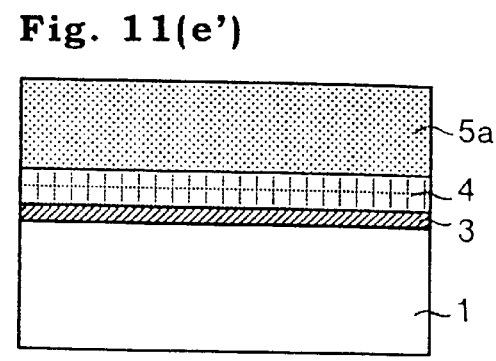
Fig. 11(f) 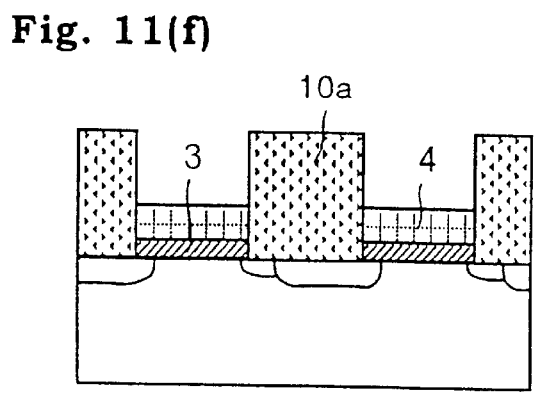 Fig. 11(f') 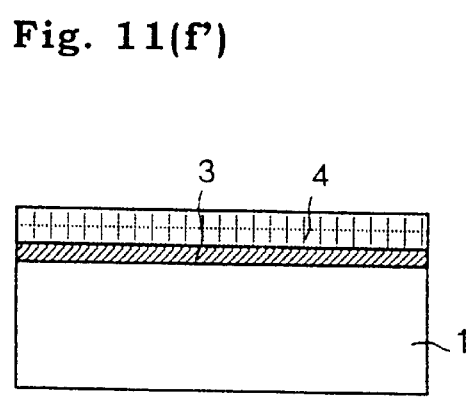
Fig. 11(g) 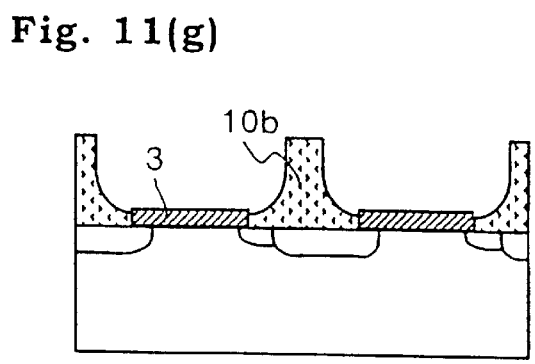 Fig. 11(g') 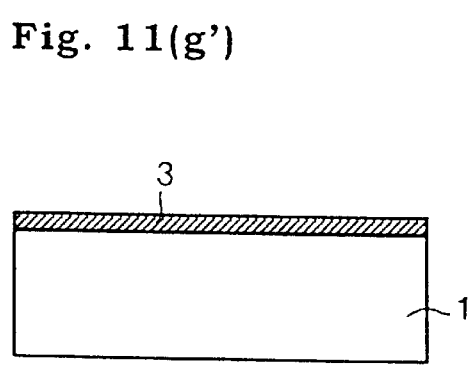
Fig. 11(h) 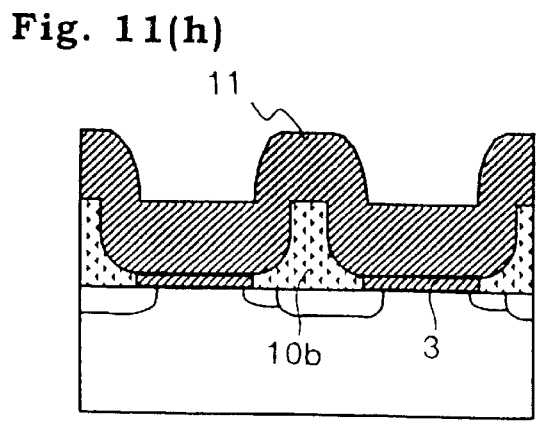 Fig. 11(h') 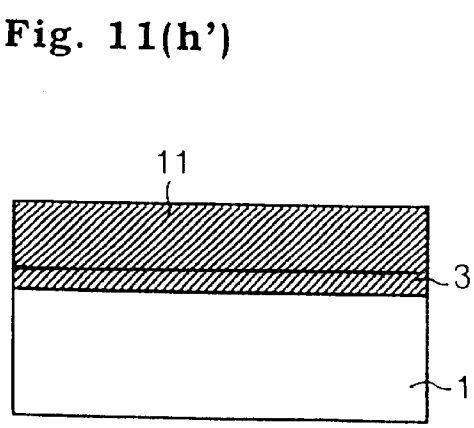

Fig. 11(i)
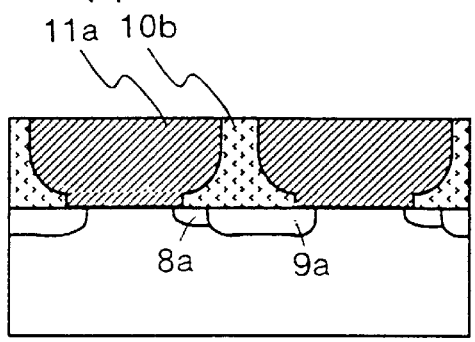
Fig. 11(i')
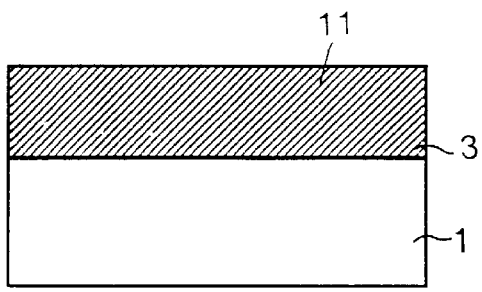
Fig. 11(j)
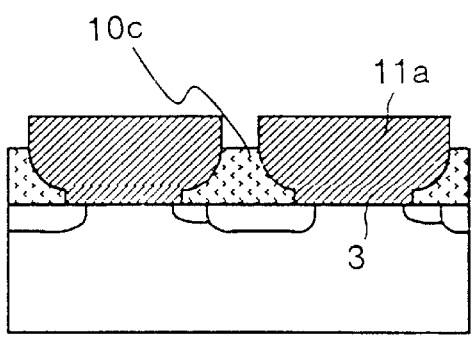
Fig. 11(j')
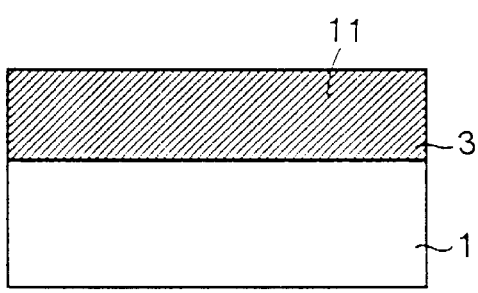
Fig. 11(k)
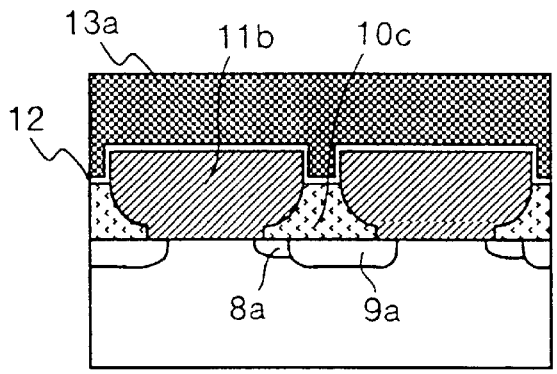
Fig. 11(k')
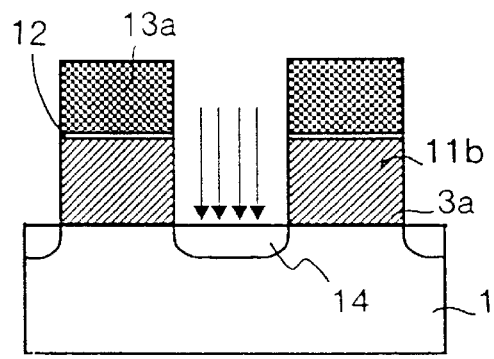

Fig. 14(a) Prior Art
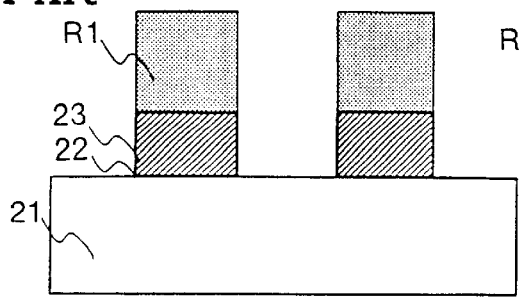
Fig. 14(a') Prior Art
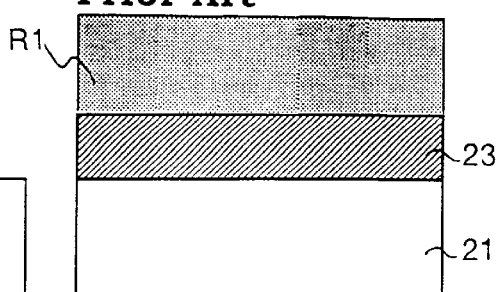
Fig. 14(b) Prior Art
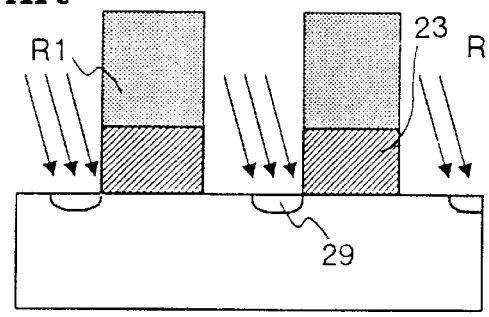
Fig. 14(b') Prior Art
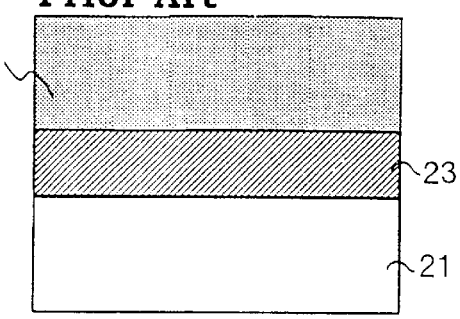
Fig. 14(c) Prior Art
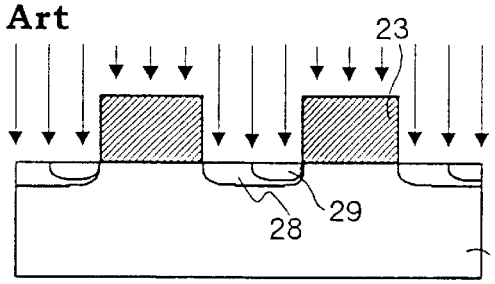
Fig. 14(c') Prior Art
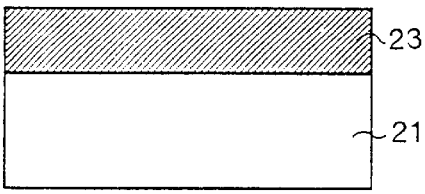
Fig. 14(d) Prior Art
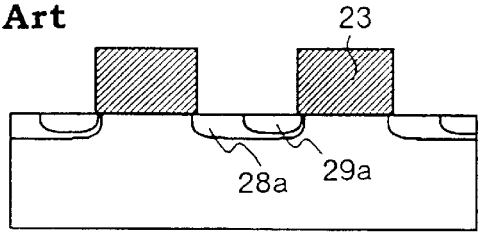
Fig. 14(d') Prior Art
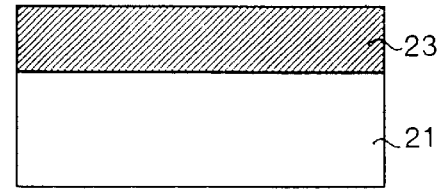
Fig. 14(e) Prior Art
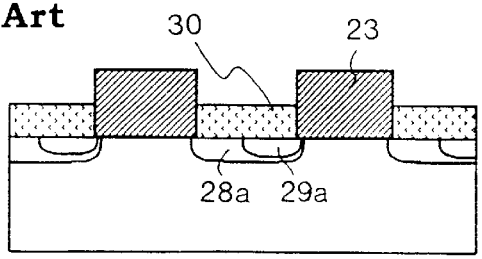
Fig. 14(e') Prior Art
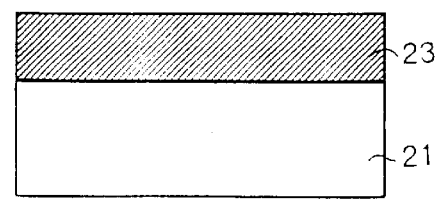

Fig. 14(f) Prior Art
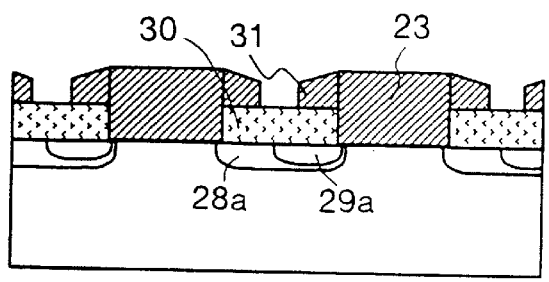
Fig. 14(f') Prior Art
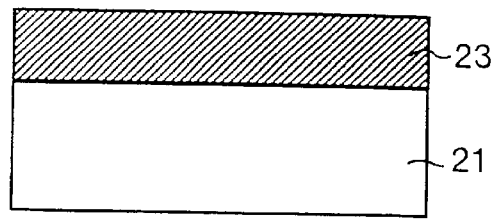
Fig. 14(g) Prior Art
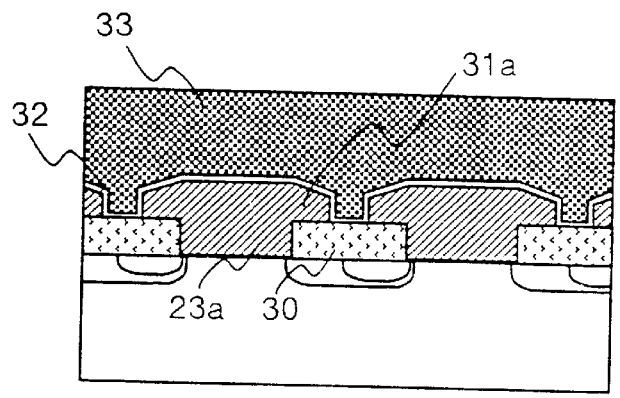
Fig. 14(g') Prior Art
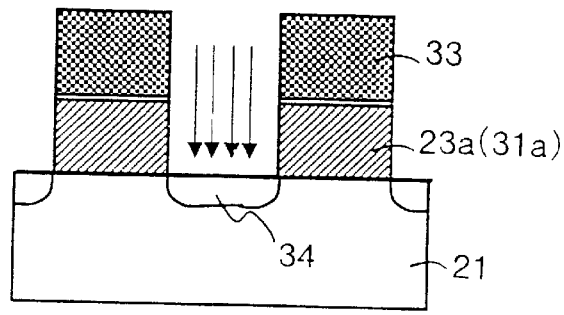

PROCESS FOR MANUFACTURING SEMICONDUCTOR MEMORY DEVICE HAVING FLOATING AND CONTROL GATES IN WHICH MULTIPLE INSULATING FILMS ARE FORMED OVER FLOATING GATES

This application is a division of application Ser. No. 09/588,761, filed Jun. 6, 2000, the entire content of which is hereby incorporated by reference in this application now U.S. Pat. No. 6,441,430.

CROSS-REFERENCE TO RELATED APPLICATION

This application is related to Japanese application No. HEI 11 (1999)-218971, filed on Aug. 2, 1999, whose priority is claimed under 35 USC §119, the disclosure of which is incorporated by reference in its entirety.

BACKGROUND OF THE INVENTION

1. Field of the Invention

The present invention relates to a process for manufacturing a semiconductor memory device. More particularly, it relates to a process for manufacturing a semiconductor memory device having floating gates and control gates in which insulating films are provided between the floating gates.

2. Description of Related Art

In the field of semiconductor memory devices having floating gates and control gates, a technique for increasing a coupling ratio [$C_2/(C_1+C_2)$, $C_1$: a coupling capacitance between a floating gate and a semiconductor substrate, $C_2$: a coupling capacitance between a floating gate and a control gate] has been proposed with the intension of reducing voltage, for example, by Japanese Unexamined Patent Publication No. HEI 9-102554.

Hereinafter, a process for manufacturing a semiconductor memory device based on this technique will be explained. FIGS. 14(a) to 14(g) are sectional views taken along the line X–X' in FIG. 13(a) and FIGS. 14(a') to 14(g') are sectional views taken along the line Y–Y' in FIG. 13(a).

First, as shown in FIGS. 14(a) and 14(a'), a tunnel oxide film 22 of about 10 nm thick is formed on an active region of a p-type semiconductor substrate 21 by thermal oxidation. Then, a phosphorus-doped polysilicon film 23 of 100 to 200 nm thick is formed thereon as a material for a lower floating gate. A resist film is formed thereon and patterned by photolithography to form a resist pattern R1 (see FIG. 13(b)). Using the resist pattern R1 as a mask, the polysilicon film 23 and the tunnel oxide film 22 are sequentially etched into a floating gate by reactive ion etching (RIE) method.

Next, as shown in FIGS. 14(b) and 14(b'), using the resist pattern R1 and the polysilicon film 23 as a mask, arsenic ions, for example, are implanted at an angle inclined by 7° from a normal line with respect to the substrate surface (hereinafter abbreviated as "at 7°") at an implantation energy of 70 keV in a dose of $1\times10^{15}/cm^2$ to form a high concentration impurity layer 29.

As shown in FIGS. 14(c) and 14(c'), the resist pattern R1 is removed and then phosphorus ions, for example, are implanted along the direction perpendicular to the substrate surface (hereinafter abbreviated as "at 0°") at an implantation energy of 50 keV in a dose of $3\times10^{13}/cm^2$ using the polysilicon film 23 as a mask to form a low concentration impurity layer 28.

Then, as shown in FIGS. 14(d) and 14(d'), the resulting semiconductor substrate 21 is heated at 900° C. for 10 minutes under nitrogen atmosphere to form impurity layers 28a and 29a in which impurities are activated.

As shown in FIGS. 14(e) and 14(e'), a silicon oxide film of about 200 to 300 nm thick is formed on the entire surface of the semiconductor substrate 21 by chemical vapor deposition (CVD) method and etched back by RIE method until the polysilicon film 23 is exposed to form a buried insulating film 30 in a space between the floating gates. At this time, the buried insulating film 30 is arranged so that sidewalls of the polysilicon film 23 are partially exposed.

Then, as shown in FIGS. 14(f) and 14(f'), for increasing the gate coupling ratio, a phosphorus-doped polysilicon film of about 100 nm thick is formed on the entire surface of the semiconductor substrate 21 and etched back by RIE method to form a polysilicon film 31 which will be a projection of the floating gate.

Next, as shown in FIGS. 14(g) and 14(g'), a silicon oxide film of 6 nm thick by thermal oxidation, a silicon nitride film of 8 nm thick by CVD method and a silicon oxide film of 6 nm thick by CVD method are deposited in this order on the semiconductor substrate 21 to form an ONO film 32 as a dielectric film between the floating gate and the control gate. Further, a phosphorus-doped polysilicon film of 100 nm thick and a tungsten silicide film of 100 nm thick are sequentially formed thereon to provide a polycide film of 200 nm thick. A resist film is formed thereon (not illustrated) and patterned into a resist pattern R3 by photolithography (see FIG. 13(b)). Using the resist pattern R3 as a mask, the polycide film, the ONO film 32, the polysilicon film 31 and the polysilicon film 23 are etched successively by RIB method to form a control gate 33 and floating gates 23a and 31a.

The resist pattern R3 is removed and then boron ions, for example, are implanted at 0°, 10 to 40 keV and $5\times10^{12}$ to $5\times10^{13}/cm^2$ using the control gate 33 as a mask to form an impurity layer 34 for memory device isolation.

Thereafter, interlayer insulating film, contact hole and metal wiring are formed by a known technique to complete a semiconductor memory device.

FIG. 15 shows an equivalent circuit diagram of a semiconductor memory device having asymmetric source/drain regions in which a coupling ratio $C_2/C_1$ is increased as described above.

In FIG. 15, Tr.00 to Tr.32 indicate memory cells each having a floating gate, WL 0 to 3 indicate word lines connected to the control gates of the memory cells and BL 0 to 3 are bit lines connected to the common source/drain diffused wiring layers of the memory cells. The word line WL 0 is connected to the control gates of Tr.00, Tr.01 and Tr.02, and the word line WL 1 is connected to the control gates of Tr.10, Tr.11 and Tr.12, respectively. The bit line BL 1 is connected to the drains of Tr.01, Tr.11, Tr.21 and Tr.31 or the sources of Tr.00, Tr.10, Tr.20 and Tr.30. The bit line BL 2 is connected to the drains of Tr.02, Tr.12, Tr.22 and Tr.32 or the sources of Tr.01, Tr.11, Tr.21 and Tr.31.

Table 1 shows operating voltages at reading, writing and erasing in Tr.11 of FIG. 15. Further, FIG. 16 shows a state where information is read from the selected memory cell Tr.11, FIG. 17 a state where information is written in Tr.11 and FIG. 18 a state where information is erased from Tr.10 to Tr.12 connected to the word line WL 1 including Tr.11.

TABLE 1

| | WL Selected WL 1 | WL not selected WL 0, 2 | BL Selected BL 1 | BL not selected BL 0, 3 | SL BL 2 | Substrate PW |
|---|---|---|---|---|---|---|
| Reading | 3 | 0 | 0 | open | 1 | 0 |
| Writing | −12 | open | 4 | open | open | 0 |
| Erasing | 12 | open | −8 | −8 | −8 | −8 |

Writing in the memory cell is defined as Vth<2V and erasing is defined as Vth>4V.

As shown in FIG. 16 and Table 1, information of the memory cell is read by applying a voltage of 3V to the control gate, grounding the substrate and the drain, and applying a voltage of 1V to the source so as to pass current i.

As shown in FIG. 17 and Table 1, information is written in Tr.11 by applying −12V to the control gate, grounding the substrate and applying 4V to the drain so that electrons are drawn from the floating gate utilizing a FN tunneling current flowing through a thin oxide film in a region where the drain and the floating gate are overlapped. At this time, a voltage of 4V applied to the drain is also applied to the source of Tr.10 sharing the common diffused wiring layer with the drain of Tr.11. However, a depletion layer is formed within the substrate because the impurity concentration in the source is low and an electric field actually applied to the thin oxide film in the overlapped region of the source and the floating gate is not sufficient to generate the FN tunneling current. As a result, information is selectively written only in the memory cell including the floating gate overlapped with the drain (high concentration impurity layer).

As shown in FIG. 18 and Table 1, information is erased from Tr.11 by applying 12V to the control gate, and −8V to the source/drain and the substrate so that electrons are injected into the floating gate utilizing the FN tunneling current flowing through the entire channel. At this time, the same voltage is applied to the substrate, the control gates and the sources/drains of Tr.10 and Tr.12 connected with Tr.11 through the word line WL 1, so that data of the memory cells connected to the selected word line are erased at the same time.

As shown in FIG. 14(g) and 14(g'), at the patterning of the polysilicon films 23 and 31 into the floating gates 23a and 31a, and the polycide film into the control gate 33, the buried insulating film 30 is exposed when the polycide film, the ONO film 32 and the polysilicon film 31 are removed by etching method. Accordingly, the buried insulating film 30 serves as a protective film against the etching. Further, on the surface of the buried insulating film 30, a reaction product 35 (not shown in FIG. 14, but see FIG. 19b) is generated which ensures a high selective etching rate of the polysilicon and functions as a protection of the surface of the buried insulating film 30.

As the polysilicon film 23 is further etched, a portion 23b of the polysilicon film 23 remains on vertical sidewalls of the buried insulating film 30 in a fence-like form slightly lower than the height of the buried insulating film 30 as shown in FIG. 19(a). This is because the reaction product 35 generated on the surface of the buried insulating film 30 extends to or covers the polysilicon film on the sides of the buried insulating film 30 so that the etching of the polysilicon film 23b on the sidewalls of the buried insulating film 30 is locally slowed, as shown in FIG. 19(b).

The thus remained polysilicon film 23b causes a short circuit of the floating gate which is supposed to be isolated at the patterning of the control gate. This leads to a failure of the semiconductor memory device.

Where the polysilicon film 23 is etched at a high selective rate with respect to the buried insulating film 30 as in the above-described case, the height of the buried insulating film 30 should be about 50 nm or less so as not to leave the polysilicon film 23b in the fence-like form.

On the other hand, where the polysilicon film is etched at a low selective rate with respect to the buried insulating film 30, generation of the reaction product on the surface of the buried insulating film 30 is inhibited. Accordingly, the buried insulating film 30 is reduced in height while etching the polysilicon film 23. Only when the height is 50 nm or less, remaining of the polysilicon film 23b in the fence-like form is avoided.

However, where the polysilicon film is etched at a low selective rate as mentioned above, it is hard to control the height of the buried insulating film 30 to be 50 nm or less when the etching of the polysilicon film is finished. That is, it is extremely difficult to control the thickness of the buried insulating film 30 in consideration of variation in forming the buried insulating film 30, variation in etching back the buried insulating film 30 and variation in film reduction of the buried insulating film while etching the polysilicon film.

Further, in terms of variation in a film which will be formed thereon in a later step such as a control gate 33, it is essential to use a polysilicon film having a high selective etching rate with respect to the buried insulating film 30 to compensate the variations.

Accordingly, a conductive film having a high selective etching rate with respect to an insulating film is required as well as the insulating film contacting the sides of the polysilicon film needs to be thinned.

Moreover, when the control gate 33 is patterned, the polysilicon film for the control gate, the ONO film 32 and the polysilicon film for the floating gate are etched in this order. Therefore an etching protective film having enough thickness in view of the thickness of the ONO film 32 to be etched is required. That is, the buried insulating film 30 which serves as the etching protective film and is filled in the space between the polysilicon films needs to be formed thicker than the total thickness of the floating gate and the ONO film.

However, this is inconsistent with the need of the thin buried insulating film described above, which makes the formation of the control gate 33 difficult.

Further, for etching back the polysilicon film into a projection of the floating gate to increase the coupling ratio, the width of the space between the floating gates needs to be about three times greater than the thickness of the polysilicon film. Otherwise the polysilicon film is buried in the space and cannot be formed into a sidewall spacer shape by the etching back process. Thus, it is hard to miniaturize the semiconductor device because of the need to ensure the space.

SUMMARY OF THE INVENTION

The present invention has been achieved in view of the above drawbacks of the conventional devices. The present invention intends to provide a process for manufacturing a semiconductor memory device having floating gates and control gates, wherein an etching protecting film used at the formation of the control gate is formed in self-alignment with respect to a lower floating gate, and an upper floating gate is formed in self-alignment with respect to the etching protective film, thereby miniaturizing memory cells and facilitating the formation of the control gate.

The present invention provides a process for manufacturing a semiconductor memory device comprising the steps of: (a) forming a tunnel oxide film, a first conductive film to be a lower floating gate, a first insulating film and a second insulating film in this order on a semiconductor substrate and patterning the second insulating film, the first insulating film, the first conductive film and the tunnel oxide film into a desired configuration; (b) forming a third insulating film on the entire surface of the resulting semiconductor substrate; (c) reducing the third insulating film until the second insulating film is exposed; (d) removing the second insulating film; (e) removing the first insulating film while further reducing the third insulating film; (f) forming a second conductive film to be an upper floating gate on the first conductive film and the third insulating film; (g) flattening the second conductive film until the third insulating film is exposed; and (h) forming an interlayer capacitance film and a third conductive film to be a control gate on the second conductive film and the third insulating film, and patterning the third conductive film, the interlayer capacitance film, the second conductive film and the first conductive film to form a floating gate and the control gate.

Further, the present invention provides a semiconductor memory device comprising: a plurality of floating gates formed on a semiconductor substrate with intervention of a tunnel oxide film; an interlayer capacitance film formed on the floating gate; and a control gate formed on the interlayer insulating film, wherein the floating gate comprises a lower floating gate whose sidewalls are substantially vertical to the surface of the semiconductor substrate and an upper floating gate formed in a shape gradually widened towards its top on the lower floating gate, and an insulating film having lower sides substantially vertical to the surface of the semiconductor substrate and upper sides gradually narrowed towards its top in correspondence with the shape of the lower and upper floating gates.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

FIGS. 1(a) and 1(b) are schematic plan views illustrating a process for manufacturing a semiconductor memory device according to the present invention;

FIGS. 2(a) to 2(j) and 2(a') to 2(j') are schematic sectional views illustrating Example 1 of the process for manufacturing the semiconductor memory device according to the present invention;

FIGS. 4(a) to 4(k) and 4(a') to 4(k') are schematic sectional views illustrating Example 3 of the process for manufacturing the semiconductor memory device according to the present invention;

FIGS. 5(a) to 5(k) and 5(a') to 5(k') are schematic sectional views illustrating Example 4 of the process for manufacturing the semiconductor memory device according to the present invention;

FIGS. 6(a) to 6(k) and 6(a') to 6(k') are schematic sectional views illustrating Example 5 of the process for manufacturing the semiconductor memory device according to the present invention;

FIGS. 7(a) to 7(l) and 7(a') to 7(l') are schematic sectional views illustrating Example 6 of the process for manufacturing the semiconductor memory device according to the present invention;

FIGS. 9(a) to 9(j) and 9(a') to 9(j') are schematic sectional views illustrating Example 8 of the process for manufacturing the semiconductor memory device according to the present invention;

FIGS. 10(a) and 10(b) are schematic sectional views illustrating Example 9 of the process for manufacturing the semiconductor memory device according to the present invention;

FIGS. 11(a) to 11(k) and 11(a') to 11(k') are schematic sectional views illustrating Example 10 of the process for manufacturing the semiconductor memory device according to the present invention;

FIGS. 14(a) to 14(g) and 14(a') to 14(g') are schematic sectional views illustrating the process for manufacturing a conventional semiconductor memory device.

DESCRIPTION OF THE PREFERRED EMBODIMENTS

Figure 2A:
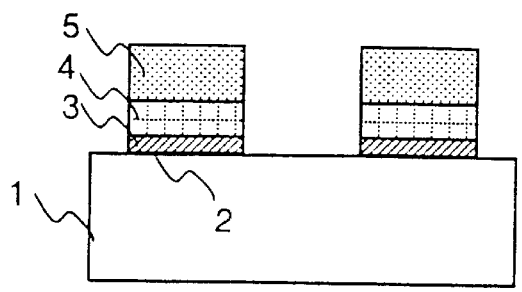

In the step (a) of the process for manufacturing the semiconductor memory device according to the present invention, a tunnel oxide film, a first conductive film to be formed into a lower floating gate, a first insulating film and a second insulating film are formed on a semiconductor substrate in this order, and patterned sequentially into a desired configuration.

A material for the semiconductor substrate used herein is not particularly limited as long as it is commonly used for a substrate of semiconductor memory device, for example, element semiconductors such as silicon and germanium, compound semiconductors such as GaAs, InGaAs, ZnSe and the like can be used. Among them, silicon substrate is preferable.

The tunnel oxide film can be formed to have a thickness of about 7 to about 15 nm by a known technique such as thermal oxidization, for example, of silicon.

A material for the first conductive film is not particularly limited as long as it is commonly used for a floating gate. For example, polysilicon, metal(s) such as copper and aluminum, high melting point metal(s) such as tungsten, tantalum and titanium, silicides with high melting point metals and polycides with high melting point metals can be used. Among them, polysilicon film is preferable. The first conductive film can be formed into about 50 to about 150 nm thick by a known technique such as sputtering, vapor deposition or CVD method.

As the first insulating film, for example, a film having a relatively high etching rate such as a silicon oxide film or a silicon nitride film can be formed into a thickness of about 50 to about 150 nm by CVD method or the like. As the second insulating film, for example, a silicon oxide film or the like can be formed into a thickness of about 300 to about 800 nm by CVD method or the like. Materials, quality and formation processes of the first and second insulating films can be suitably selected in terms of the etching rate with respect to other films formed in later steps.

The second insulating film, the first insulating film, the first conductive film and the tunnel oxide film can be patterned by using a resist mask of a desired configuration formed by known photolithography and etching method. The first and second insulating films may be patterned into an upright or a tapered shape. Here, the tapered shape includes a shape gradually narrowed in a liner, stepwise or curved fashion towards its top. Tapered angle thereof can be suitably selected since it influences a curvature of an arc formed in a third insulating film in a later step (e). For example, tapered angle of about 60° to 90° is used. The patterning into the upright or tapered shape can be performed by a known technique, for example, a process of etching in two steps and controlling the generation of reaction products on the sidewalls of the insulating film during the respective etching steps in case of the tapered shape.

Before the step (b), a sidewall insulating film and/or a thermal oxide film may be formed on the sidewalls of the patterned first conductive film. The sidewall insulating film may have substantially the same etching rate as that of the first insulating film. The sidewall insulating film may be formed not only on the sidewalls of the first conductive film but also the sidewalls of the first and second insulating films. For example, a film made of the same material by the same process as the first insulating film can be used as the sidewall insulating film. Alternatively, the sidewall insulating film may be formed of a material whose etching rate is reduced to substantially the same degree as that of the first insulating film through densification, for example, by heat treatment. The sidewall insulating film may be formed by a known technique, for example, depositing an insulating film of a predetermined thickness on the entire surface of the semiconductor substrate followed by etching.

The thermal oxide film may be formed, for example, by heating the semiconductor substrate on which the first insulating film has been formed at a temperature of about 800 to about 1000° C. for about 1 to about 100 minutes under an oxygen atmosphere or air. The thickness of the oxide film is about 2 to about 50 nm, for example. The thermal oxidization generates the oxide film not only on the sidewalls of the first conductive film but also on the exposed surface of the semiconductor substrate. The oxide film on the surface of the semiconductor substrate is preferably removed, for example, by dry etching method after the thermal oxidization.

After forming the thermal oxide film, an insulating film may be formed. Then, the insulating film and the oxide film are sequentially etched back so that the oxide film is formed on the sidewalls of the patterned first conductive film and on the semiconductor substrate at the outside periphery of the first conductive film, and the sidewall insulating film is formed on the oxide film and on the sidewalls of the first and second insulating films.

In the step (b), a third insulating film is formed on the entire surface of the resulting semiconductor substrate. As the third insulating film, an insulating film is used whose etching rate is set almost the same degree as that of the first insulating film in isotropic etching using a diluted HF. For example, where a silicon oxide film is formed by CVD method as the first insulating film, the third insulating film may be a silicon oxide film formed by CVD method, a silicon oxide film formed by plasma CVD method, a silicon oxide film formed by high density plasma CVD (HDP-CVD) method or the like. The thickness of the third insulating film may be about 400 to about 600 nm.

In the step (c), the third insulating film is reduced until the second insulating film is exposed. Thus, the third insulating film is filled between the patterned first conductive films (lower floating gates). A process for the reduction may be suitably selected in accordance with materials, film quality and the like of the second and third insulating films. For example, wet etching method using hydrofluoric acid, heated phosphoric acid, nitric acid, sulfuric acid or the like, dry etching method such as RIE method, CMP (chemical mechanical polishing) method may be used. Where a silicon nitride film is used as the second insulating film and a silicon oxide film formed by HDP-CVD method is used as the third insulating film, wet etching method with hydrofluoric acid or CMP method is preferable.

In the step (d), the second insulating film is removed. The removal may be performed by the same process used for reducing the third insulating film in the step (c), but preferably, by a process capable of selectively etching the second insulating film rather than the third insulating film. Where a silicon nitride film and a silicon oxide film formed by HDP-CVD method are used as the second insulating film and the third insulating film, respectively, wet etching method using heated phosphoric acid is preferable.

In the step (e), the first insulating film is removed while further reducing the third insulating film. That is, the first insulating film is completely removed whereas the third insulating film is not removed completely and preferably etched so that a corner near the first insulating film is rounded. Specifically, the removal may be performed by the same process as in the step (c). A process capable of etching the third insulating film at an etching rate smaller than or substantially the same as that of the first insulating film is preferable. For example, wet etching method using hydrofluoric acid is preferable. The difference between the etching rates of the first and third insulating films influences a curvature of the round shape of the third insulating film. That is, where the etching rate is substantially the same between the first and third insulating films, the curvature of the resulting third insulating film becomes gentle as compared with the case where the etching rate is smaller than that of the first insulating film. Accordingly, the formation of a control gate performed in a later step, in particular, at the round portion, is facilitated.

Further, in the case where a sidewall insulating film and/or the thermal oxide film (having substantially the same etching rate as the first insulating film) is/are formed on the sidewalls of the patterned first conductive film in a previous step, the curvature of the round shape of the third insulating film can be suitably adjusted (gentle or abrupt) in accordance with the etching rate of the sidewall insulating film and/or the oxide film. In particular, where a thermal treatment is performed after the formation of the oxide film or the sidewall insulating film, the second insulating film and the sidewall insulating film can be densified, thereby lowering their etching rates. Accordingly, the curvature of the round shape of the third insulating film can be easily adjusted in this step.

In the step (f), a second conductive film as an upper floating gate material is formed on the first conductive film and the third insulating film. The second conductive film may be formed of the same materials by the same process as those for the first conductive film. Among them, polysilicon is preferable. The first and second conductive films are not necessarily formed of the same material, but preferably formed of the same material. The thickness of the second conductive film can be suitably adjusted in accordance with the thickness of the first conductive film, the remaining third insulating film and the like, but preferably formed slightly thicker than the remaining third insulating film, more specifically, in about 100 to about 200 nm thick.

In the step (g), the second conductive film is flattened until the third insulating film is exposed. The flattening may be performed by any reduction process mentioned in the step (c), among which CMP method is preferable. Accordingly, the surfaces of the second conductive film and the third insulating film can be flattened.

An additional process may be performed to remove a small amount of the third insulating film so that a part of the sidewalls of the second conductive film is exposed. Preferably, the removal of the third insulating film in this process is performed by selectively removing the third insulating film. The thickness to be removed is about 10 to about 50 nm.

In the step (h), an interlayer capacitance film and a third conductive film as a material for a control gate are formed on the second conductive film and the third insulating film. For example, a silicon oxide film, a silicon nitride film or a laminated film thereof can be formed as the interlayer capacitance film in the same manner as described above. The thickness of the interlayer capacitance film is about 10 to about 20 nm.

The third conductive film can be formed of the same material by the same process as those for the first conductive film. The first and third conductive films may be formed of the same film or different films. A polycide film made of a high melting point metal is preferable. The thickness of the third conductive film is not particularly limited, but for example, about 100 to about 300 nm is mentioned.

The third conductive film, the interlayer capacitance film, the second conductive film and the first conductive film are patterned in this order. The patterning is performed in the same manner as in the step (a).

According to these steps, the first conductive film preliminarily patterned in the step (a) is formed into a lower floating gate, the second conductive film, which is filled in a space between the third insulating films and whose surface is flattened, in the step (g) is formed into an upper floating gate. The third conductive film formed on the upper floating gate is formed into a unitary control gate on a plurality of the floating gates. The interlayer capacitance film is formed into the same configuration as the third conductive film.

In the process for manufacturing the semiconductor memory device according to the present invention, an ion implantation for forming a low concentration and/or a high concentration impurity layer is preferably performed before, during or after a desired process. The ion implantation may be performed to form the impunity layers at both sides of the floating gate symmetrically or asymmetrically. Further, the ion implantation may be performed at an angle perpendicular to the substrate or at an angle inclined by a desired degree in accordance with positions at which the impurity layers are formed, impurity concentrations thereof, methods for ion implantation and the like.

A semiconductor memory device obtained by the process for manufacturing the semiconductor memory device of the present invention can be operated in substantially the same manner as described for the conventional device.

Hereinafter, examples of the process for manufacturing the semiconductor memory device and the semiconductor memory device according to the present invention are explained with reference to the drawings.

EXAMPLE 1

As shown in FIG. 1(*a*), a semiconductor memory device formed in this example comprises a floating gate consisted of a lower floating gate and an upper floating gate layered thereon, and a control gate formed on the floating gate.

A process for manufacturing such a semiconductor memory device will be explained. FIGS. 2(*a*) to 2(*j*) are sectional views taken along the line X–X' in FIG. 1(*a*) and FIGS. 2(*a'*) to 2(*j'*) are sectional views taken along the line Y–Y' in FIG. 1(*a*).

First, as shown in FIGS. 2(*a*) and 2(*a'*), a tunnel oxide film 2 made of a silicon oxide film of about 10 nm thick is formed on an active region of a p-type semiconductor substrate 1 by thermal oxidization. A phosphorus-doped polysilicon film 3 of 50 nm thick is formed thereon as a material for a lower floating gate, and a silicon oxide film 4 of about 50 to about 150 nm thick and a silicon nitride film 5 of about 200 nm thick are sequentially deposited by CVD method thereon. A resist film is formed on the silicon nitride film 5 and patterned by photolithography to form a resist film R1 as shown in FIG. 1(*b*). Using the resist film R1 as a mask, the silicon nitride film 5, the silicon oxide film 4, the polysilicon film 3 and the tunnel oxide film 2 are sequentially etched to form a lower floating gate.

The resist film R1 is removed and then, as shown in FIGS. 2(*b*) and 2(*b'*), arsenic ions, for example, are implanted at 0° at an implantation energy of about 5 to about 40 keV in a dose of about $5 \times 10^{12}$ to about $5 \times 10^{13}/cm^2$. Further, as shown in FIGS. 2(*c*) and 2(*c'*), arsenic ions, for example, are implanted at about −7° to about −25°, about 5 to about 40 keV and about $1 \times 10^{15}$ to about $1 \times 10^{16}/cm^2$. Thus, impurity layers 8 and 9 are formed. Impurities are activated by a thermal treatment, forming layers 8*a* and 9*a*.

Successively, as shown in FIGS. 2(*d*) and 2(*d'*), a silicon oxide film 10 of about 400 to about 600 nm thick is deposited by HDP-CVD method.

Then, as shown in FIGS. 2(*e*) and 2(*e'*), the surface of the silicon oxide film 10 is etched by wet etching method using diluted hydrofluoric acid to fully expose the top surface of the patterned silicon nitride film 5, thereby firming a buried insulating film 10a. Incidentally, projections specific to an oxide film formed by HDP-CVD method are formed on the surface of the silicon oxide film 10 immediately above the silicon nitride film 5. The etching in this step is performed while removing the projections.

Figure 2B:
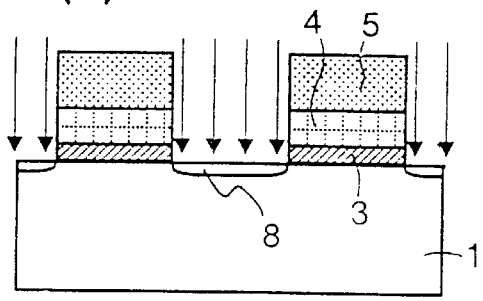
Figure 2C:
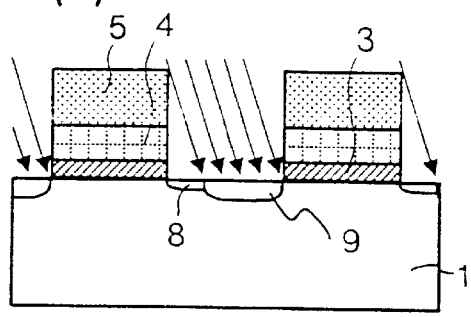
Figure 2D:
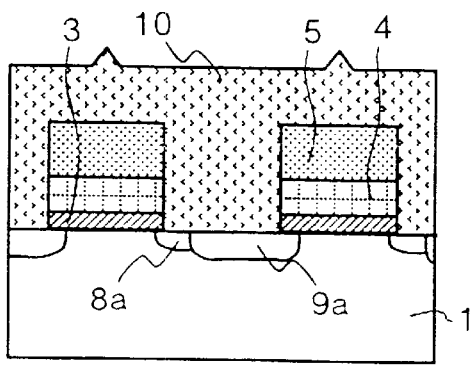
Figure 2E:
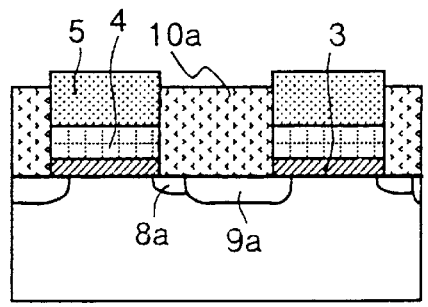
Figure 2F:
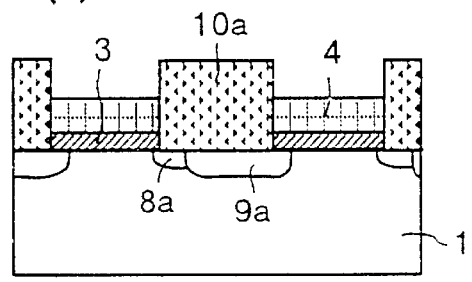
Figure 2G:
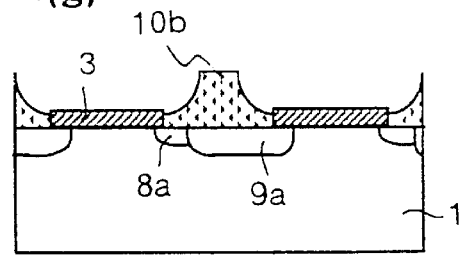

Then, as shown in FIGS. 2(f) and 2(f'), the silicon nitride film 5 is removed by wet etching method using heated phosphoric acid. Further, as shown in FIGS. 2(g) and 2(g'), the buried insulating film 10a is etched into a round shape while removing the silicon oxide film 4 by wet etching method using diluted hydrofluoric acid. Thus, a buried insulating film 10b is filled in a space between the lower floating gates.

Figure 2H:
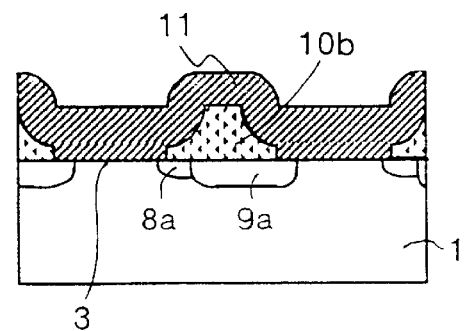

Next, as shown in FIGS. 2(h) and 2(h'), for increasing the gate coupling ratio, a phosphorus-doped polysilicon film 11 of about 100 nm thick is formed and polished by CMP method until the buried insulating film 10b in the space between the lower floating gates is exposed as shown in FIGS. 2(i) and 2(i'). Thus, an upper floating gate is formed.

Thereafter, a silicon oxide film of about 6 nm thick by thermal oxidization, a silicon nitride film of about 8 nm thick by CVD method and a silicon oxide film of about 6 nm thick by CVD method are deposited in this order on the surface of the upper floating gate to form an ONO film 12. Then, for example, a phosphorus-doped polysilicon film of about 100 nm thick and a tungsten suicide film of about 100 nm thick are formed thereon to form a polycide film 13a of about 200 nm thick as a control gate material. Further, a resist film R3 (not illustrated in FIGS. 2(i)–(j)) as shown in FIG. 1(b) is formed by photolithography. Using the resist film R3 as a mask, the polycide film 13a, the ONO film 12, the polysilicon film 11a and the polysilicon film 3 are sequentially etched to form a control gate 13a and a floating gate comprised of an upper floating gate 11b and a lower floating gate 3a. Then, the resist film R3 is removed and, as shown in FIGS. 2(j) and 2(j'), boron ions, for example, are implanted at 0°, about 10 to about 40 KeV and about $5\times10^{12}$ to about $5\times10^{13}/cm^2$ using the control gate 13a as a mask to form an impurity layer 14 for memory device isolation.

Thereafter, interlayer insulating film, contact hole and metal wiring are formed to complete a semiconductor memory device.

According to the above-described process for manufacturing the semiconductor memory device, various merits are obtained as follows.

1) According to the present invention, the buried insulating film 10a formed by HDP-CVD method is isotropically etched into a round shape while removing the silicon oxide film 4 on the polysilicon film 3. Therefore, the buried insulating film remains with a thickness the same as or less than the lower floating gate 3a on the sidewalls of the lower floating gate when the removal of the silicon oxide film 4 is finished. Variation in the thickness of the buried insulating film on the sidewalls of the lower floating gate is caused by variation in forming and etching to remove the silicon oxide film 4 but irrelevant to variation in forming the buried insulating film 10. Accordingly, variation in the thickness of the buried insulating film on the sidewalls of the lower floating gate is inhibited by forming the polysilicon film 3 as a material for the lower floating gate 3a into about 50 nm thickness and the thin silicon oxide film 4, thereby controlling its thickness into a desired one.

Further, 2) since the buried insulating film 10a is etched into an upward convex-like shape with round corners, the polysilicon film as the upper floating gate is prevented from remaining while etching to form the control gate.

Still further, 3) the difference in the etching rate between the silicon oxide film 4 and the buried insulating film 10a affects the curvature of the round portion of the buried insulating film 10a. Therefore, by setting the etching rate ratio as silicon oxide film 4/buried insulating film 10a>1, the width of the round portion of the buried insulating film 10a can be reduced less than the thickness of the silicon oxide film. This enables the miniaturization of the width of the upper floating gate which will be formed in a later step.

Furthermore, 4) the height of the upper floating gate covering the round portion of the buried insulating film can be set to 50 nm or less by optionally setting the thicknesses of the silicon oxide film 4 and the buried insulating film 10a. Therefore, the upper floating gate material can be etched simultaneously with the patterning of the control gate without leaving any remains.

Moreover, 5) the buried insulating film can be formed in self-alignment with the lower floating gate and the upper floating gate can be formed in self-alignment with the buried insulating film. Therefore, the floating gate can be miniaturized, variation in the widths of the floating gate at the bottom and the top thereof can be inhibited and variation in the coupling ratio can be prevented.

Further, 6) since the surface of the upper floating gate is flattened, a thin interlayer insulating film can be formed thereon. Accordingly, the coupling ratio through the interlayer insulating film is increased, writing speed is improved and the conductive film as a material for the control gate can be deposited flatly. Therefore, excessive etching of the control gate is alleviated, thereby production costs can be reduced.

EXAMPLE 2

In the same manner as in Example 1, a tunnel oxide film 2, a polysilicon film 3, a silicon oxide film 4, a silicon nitride film 5 and impurity layers 8a and 9a are formed on an active region of a p-type semiconductor substrate 1. Further, a silicon oxide film 10 having substantially the same wet etching rate as the silicon oxide film 4 is formed by HDP-CVD method and the top surface of the silicon nitride film 5 is exposed by wet etching method using diluted hydrofluoric acid.

Figure 3A:
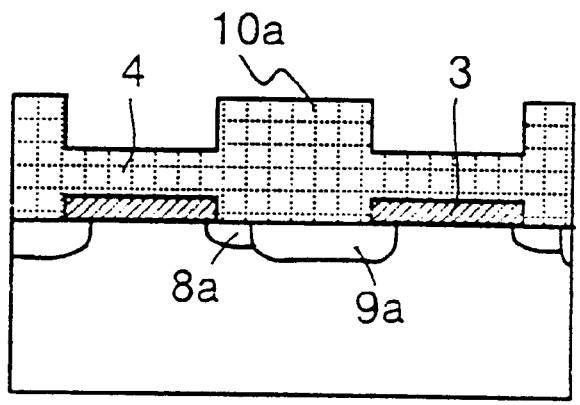
FIGS. 3(a) and 3(b) are schematic sectional views illustrating Example 2 of the process for manufacturing the semiconductor memory device according to the present invention.

Then, as shown in FIG. 3(a), the silicon nitride film 5 is removed by wet etching method using heated phosphoric acid.

Figure 3B:
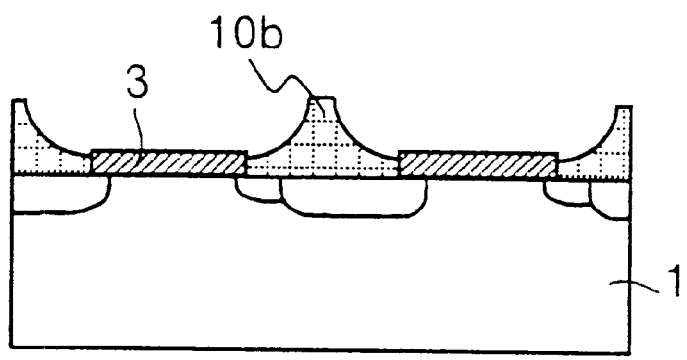

Further, as shown in FIG. 3(b), a buried insulating film 10a is etched into a round shape 10b while removing the silicon oxide film 4 by wet etching method using diluted hydrofluoric acid.

Thereafter, a semiconductor memory device is completed in the same manner as in Example 1.

According to the above-mentioned process for manufacturing the semiconductor memory device, 1) the round portion of the buried insulating film 10a can be expanded in width by setting the etching rates of the silicon oxide film 4 and the buried insulating film 10a substantially the same. Accordingly, the curvature of an upward convex of the buried insulating film becomes gentle and the patterning for the control gate at the round portion can be easier. Further, increasing the top surface area of the floating gate can improve the coupling ratio through the interlayer capacitance film and the writing speed as well.

EXAMPLE 3

In the same manner as in Example 1, a tunnel oxide film 2, a polysilicon film 3, a silicon oxide film 4 and a silicon nitride film 5 are formed on an active region of a p-type semiconductor substrate to form a lower floating gate. Then, as shown in FIGS. 4(a) and 4(a'), a silicon oxide film of about 25 nm to about 75 nm thick is deposited by CVD method and etched back by RIE method to form a sidewall insulating film 7a on the sidewalls of the lower floating gate.

Successively, as shown in FIGS. 4(b) and 4(b'), an impurity layer 8 is formed by ion implantation in the same manner as shown in FIG. 2(b) using the lower floating gate and the sidewall insulating film 7a as a mask. Then as shown in FIGS. 4(c) and 4(c'), impurities are activated by heating to form an impurity layer 8a extending below the sidewall insulating film 7a.

Then, as shown in FIGS. 4(d) and 4(d'), ion implantation is performed in the same manner as shown in FIG. 2(c) and heated to form an impurity layer 9.

Next, as shown in FIGS. 4(e) and 4(e'), a silicon oxide film 10 as an insulating film is deposited to a thickness of about 400 to about 600 nm by HDP-CVD method. A top portion of the silicon oxide film 10 is removed by wet etching method using diluted hydrofluoric acid to fully expose the top surface of the patterned silicon nitride film 5 as shown in FIGS. 4(f) and 4(f'). At this time, the silicon oxide film 10 needs to be removed so as not to expose the sidewall insulating film 7a.

Then, as shown in FIGS. 4(g) and 4(g'), the silicon nitride film 5 is removed with heated phosphoric acid. The buried insulating film 10a and the sidewall insulating film 7a are etched into a round shape while removing the silicon oxide film 4 by wet etching method using diluted hydrofluoric acid as shown in FIGS. 4(h) and 4(h'). Thus, a buried insulating film 10b and a sidewall insulating film 7b are filled in a space between the lower floating gates.

Next, as shown in FIGS. 4(i) and 4(i'), for increasing the gate coupling ratio, a phosphorus-doped polysilicon film 11 of about 100 nm thick is formed and polished by CMP method until the top surface of the buried insulating film 10b in the space between the lower floating gates is exposed as shown in FIGS. 4(j) and 4(j'), and thus an upper floating gate is formed.

Thereafter, as shown in FIGS. 4(k) and 4(k'), an ONO film 12 and a polyside film 13 are formed in the same manner as in Example 1 and etched sequentially to form a control gate 13a and a floating gate comprising the upper floating gate 11b and the lower floating gate 3a. Then, an impurity layer 14 for memory device isolation is formed.

Successively, interlayer insulating film, contact hole and metal wiring are formed by a known technique to complete a semiconductor memory device.

According to the above-described process for manufacturing the semiconductor memory device, 1) the width of the round portion of the buried insulating film 10a can be easily controlled by controlling the width of the sidewall insulating film 7a. In particular, where the width of the sidewall insulating film 7a is greater than the thickness of the silicon oxide film 4, the width of the round portion of the buried insulating film 10a is determined by the etched amount by isotropic etching regardless of the etching rates of the silicon oxide film 4 and the sidewall insulating film 10a, therefore the size of the round portion can be excellently controlled.

Further, 2) the impurity layer is formed by implanting impurities via the sidewall insulating film 7a, so that the width of a region in which the impurity layer and the lower floating gate 3a are overlapped can be optimized by controlling the width of the sidewall insulating film 7a. Therefore the floating gate can be easily miniaturized.

EXAMPLE 4

As shown in FIGS. 5(a) and 5(a'), a tunnel oxide film 2, a polysilicon film 3, a silicon oxide film 4 and a silicon nitride film 5 are formed sequentially on an active region of a p-type semiconductor substrate 1 to form a lower floating gate in the same manner as in Example 1.

Then, as shown in FIGS. 5(b) and 5(b'), an exposed region of the p-type semiconductor substrate 1 and the sidewalls of the polysilicon film 3 are thermally oxidized to form a silicon oxide film 6 of about 2 to about 50 nm thick. The thermal oxidization forms the silicon oxide film 4 into a dense silicon oxide film 4a having a low wet etching rate.

Next, as shown in FIGS. 5(c) and 5(c'), the silicon oxide film 6 on the p-type semiconductor substrate 1 is removed by dry etching while leaving a silicon oxide film 6a only on the sidewalls of the lower floating gate. Using the lower floating gate and the silicon oxide film 6a as a mask, ion implantation is performed in the same manner as shown in FIG. 2(b) to form an impurity layer 8.

Then, as shown in FIGS. 5(d) and 5(d'), ion implantation is performed in the same manner as shown in FIG. 2(c) to form an impurity layer 9. After that, the impurity layers 8 and 9 are activated by heating.

Next, as shown in FIGS. 5(e) and 5(e'), a buried insulating film 10 as an insulating film is deposited to about 400 to about 600 nm thick by HDP-CVD method and a top portion thereof is removed by wet etching method using diluted hydrofluoric acid to fully expose the top surface of the patterned silicon nitride film 5 as shown in FIGS. 5(f) and 5(f').

Then, as shown in FIGS. 5(g) and 5(g'), the silicon nitride film 5 is removed by wet etching method using heated phosphoric acid. The buried insulating film 10a is etched in a round shape while removing the silicon oxide film 4 by wet etching method using diluted hydrofluoric acid. Thus, a buried insulating film 10b is filled in a space between the lower floating gates.

Then, as shown in FIGS. 5(i) and 5(i'), for increasing the gate coupling ratio, a phosphorus-doped polysilicon film 11 of about 100 nm thick is formed and polished by CMP method until the top surface of the buried insulating film 10b in the space between the lower floating gates is exposed as shown in FIGS. 5(j) and 5(j'). Thus, a polysilicon film 11a to be an upper floating gate is formed.

Thereafter, as shown in FIGS. 5(k) and 5(k'), an ONO film 12 and a polyside film 13 are formed. Using a resist film R3 patterned by photolithography as a mask, a control gate 13a and a floating gate comprising the lower floating gate 3a and the upper floating gate 11b are patterned by RIE method. Then, an impurity layer 14 for memory device isolation is formed.

Then, interlayer insulating film, contact hole and metal wiring are formed by a known technique to complete a semiconductor memory device.

According to the above-mentioned process for manufacturing the semiconductor memory device, 1) the thermal oxidization of the sidewalls of the polysilicon film 3 makes the silicon oxide film 4 dense and the etching rate of the silicon oxide film 4 can be set to the same degree as the buried insulating film 10 deposited in a later step, thereby the width of the round portion of the buried insulating film 10a can be greater. According to this, the curvature of an upward convex of the buried insulating film 10a becomes gentle, which makes the formation of the control gate on the round portion easier. Further, increasing the top surface area of the floating gate can improve the coupling ratio through the interlayer insulating film and the writing speed as well.

EXAMPLE 5

First, as shown in FIGS. 6(a) and 6(a'), a tunnel oxide film 2, a polysilicon film 3, a silicon oxide film 4 and a silicon nitride film 5 are formed on an active region of a p-type semiconductor substrate 1 to form a lower floating gate in the same manner as in Example 1.

Then, as shown in FIGS. 6(b) and 6(b'), an exposed region of the p-type semiconductor substrate 1 and the sidewalls of the polysilicon film 3 are thermally oxidized to form an oxide film 6 of about 2 to about 50 nm thick. The thermal oxidization forms the silicon oxide film 4 into a dense silicon oxide film 4a having a low wet etching rate.

Then, as shown in FIGS. 6(c) and 6(c'), a silicon oxide film 7 of about 25 to about 75 nm thick as an insulating film material is deposited by CVD method, and then the silicon oxide film 7 and the oxide film 6 are etched back by RIE method to form sidewall insulating films 7a and 6a on the sidewalls of the lower floating gate. Using the lower floating gate and the sidewall insulating film 7a as a mask, an impurity layer 8 is formed by, for example, ion implantation in the same manner as shown in FIG. 2(b).

Then, as shown in FIGS. 6(d) and 6(d'), an impurity layer 9 is formed by ion implantation in the same manner as shown in FIG. 2(c). The impurity layers 8 and 9 are activated by heating and diffused below the lower floating gate.

Successively, as shown in FIGS. 6(e) and 6(e'), a silicon oxide film 10 of about 400 to about 600 nm thick as an insulating film is formed by HDP-CVD method. Further, a top portion of the silicon oxide film 10 is removed to fully expose the patterned silicon nitride film 5 by wet etching method using diluted hydrofluoric acid as shown in FIGS. 6(f) and 6(f').

Then, as shown in FIGS. 6(g) and 6(g'), the silicon nitride film 5 is removed by wet etching method using heated phosphoric acid. As shown in FIGS. 6(h) and 6(h'), the buried insulating film 10a and the sidewall insulating film 7a are etched into a round shape while removing the silicon oxide film 4 by wet etching method using diluted hydrofluoric acid. Thus, a buried insulating film 10b and a sidewall insulating film 7b are filled in a space between the lower floating gates.

Next, for increasing the gate coupling ratio, a phosphorus-doped polysilicon film 11 of about 100 nm thick is formed as shown in FIGS. 6(i) and 6(i') and polished by CMP method until the top surface of the buried insulating film 10b is exposed as shown in FIGS. 6(j) and 6(j'). Thus, a polysilicon film 11a to be an upper floating gate is formed.

As shown in FIGS. 6(k) and 6(k'), an ONO film 12 and a polycide film 13 are formed. Using a resist film R3 patterned by photolithography as a mask, a control gate 13a and a floating gate comprising the upper floating gate 11b and the lower floating gate 3a are patterned by RIB method. Then, an impurity layer 14 for memory device isolation is formed.

Then, interlayer insulating film, contact hole and metal wiring are formed by a known technique to complete a semiconductor memory device.

According to the above-mentioned process for manufacturing the semiconductor memory device, 1) the thermal oxidization of the sidewalls of the polysilicon film 3 makes the silicon oxide film 4 dense and the etching rate of the silicon oxide film 4 can be set to the same degree as the buried insulating film 10 to be deposited later, thereby the round portion of the buried insulating film 10a can be widened.

Further, 2) controlling the etching rate between the sidewall insulating film and the buried insulating film 10a as sidewall insulating film/buried insulating film 10a>1 enables the formation of the buried insulating film in an upward convex-like shape having a round portion with two different curvatures, which makes the formation of the control gate on the round portion easier.

EXAMPLE 6

As shown in FIGS. 7(a) and 7(a'), a tunnel oxide film 2, a polysilicon film 3, a silicon oxide film 4 and a silicon nitride film 5 are sequentially formed on an active region of a p-type semiconductor substrate 1 to form a lower floating gate in the same manner as in Example 5.

Then, as shown in FIGS. 7(b) and 7(b'), an exposed region of the p-type semiconductor substrate 1 and the sidewalls of the polysilicon film 3 are thermally oxidized to form an oxide film 6 of about 2 to about 50 nm thick. The thermal oxidization forms the silicon oxide film 4 into a dense silicon oxide film 4a having a low wet etching rate. Then, a silicon oxide film 7 of about 25 to about 75 nm thick to be an insulating film is deposited by CVD method. The silicon oxide film 7 and the oxide film 6 are etched back by RIE method to form sidewall insulating films 7a and 6a on the sidewalls of the lower floating gate.

Next, as shown in FIGS. 7(c) and 7(c'), an impurity layer 8 is formed by ion implantation in the same manner as shown in FIG. 2(b) using the lower floating gate and the sidewall insulating film 7a as a mask. Then, as shown in FIGS. 7(d) and 7(d'), an impurity layer 8a extending below the sidewall insulating film 7a is formed by heating. The heating is performed so that the sidewall insulating film 7a is densified to a sufficient extent and formed into a sidewall insulating film 7b having substantially the same wet etching rate as the silicon oxide film 4a.

Then, as shown in FIGS. 7(e) and 7(e'), impurity layers 8a and 9 are formed by, for example, ion implantation in the same manner as shown in FIG. 2(c). The impurity layers 8a and 9 are activated by heating to form an impurity layer 9a extending below the lower floating gate.

Successively, as shown in FIGS. 7(f) and 7(f'), a silicon oxide film 10 of about 400 to about 600 nm thick to be an insulating film is deposited by HDP-CVD method. Then, as shown in FIGS. 7(g) and 7(g'), a top portion of the silicon oxide film 10 is removed to fully expose the top surface of the patterned silicon nitride film 5 by wet etching method using diluted hydrofluoric acid.

As shown in FIGS. 7(h) and 7(h'), the silicon nitride film 5 is removed by wet etching method using heated phosphoric acid. Then, as shown in FIGS. 7(i) and 7(i'), the buried insulating film 10a and the sidewall insulating film 7a are etched into a round shape while removing the silicon oxide film 4 by wet etching method using diluted hydrofluoric acid. Thus, buried insulating films 10b and 7b are filled in a space between the lower floating gates.

Next, for increasing the gate coupling ratio, a phosphorus-doped polysilicon film 11 of about 100 nm thick is formed as shown in FIGS. 7(j) and 7(j') and polished by CMP method until the top surface of the buried insulating film 10b is exposed to form a polysilicon film 11a to be formed into an upper floating gate as shown in FIGS. 7(k) and 7(k').

Then, as shown in FIGS. 7(l) and 7(l'), an ONO film 12 and a polycide film 13 are deposited. Using a resist film R3 patterned by photolithography as a mask (not shown in FIGS. 7(l)–(l')), a control gate 13a and a floating gate comprising the upper floating gate 11b and the lower floating gate 3a are patterned by RIB method. Then, an impurity layer 14 for memory device isolation is formed using the control gate 13a as a mask.

Thereafter, interlayer insulating film, contact hole and metal wiring are formed by a known technique to complete a semiconductor memory device.

According to the above-mentioned process for manufacturing the semiconductor memory device, 1) the heat treatment after forming the sidewall insulating film makes the sidewall insulating film dense and the etching rate of the sidewall insulating film can be set to the same degree as the buried insulating film 10 to be deposited in a later step, thereby the width of the round portion of the buried insulating film 10a becomes greater. Accordingly, the curvature of the round portion becomes gentle, which makes patterning the control gate on the round portion easier. Further, increasing the top area of the floating gate improves the coupling ratio through the interlayer capacitance film as well as the writing speed.

Further, 2) the impurity layer is formed by implanting impurities through the sidewall insulating film. Therefore the width of a region in which the impurity layer and the lower floating gate 3a are overlapped can be optimized by controlling the width of the sidewall insulating film. Thus, the floating gate can be easily miniaturized.

EXAMPLE 7

This example is conducted in the same manner as in Example 6. First, a tunnel oxide film 2, a polysilicon film 3, a silicon oxide film 4 and a silicon nitride film 5 are formed on an active region of a p-type semiconductor substrate 1 to form a lower floating gate. Sidewall insulating films 7a and 6a are formed on the sidewalls of the lower floating gate. Further, an impurity layer 8 is formed.

After forming the impurity layer 8, the sidewall insulating film 7a is heated for densification and formed into a sidewall insulating film 7b having substantially the same wet etching rate as a silicon oxide film 4a. Then, an impurity layer 9 is formed and activated.

Figure 8A:
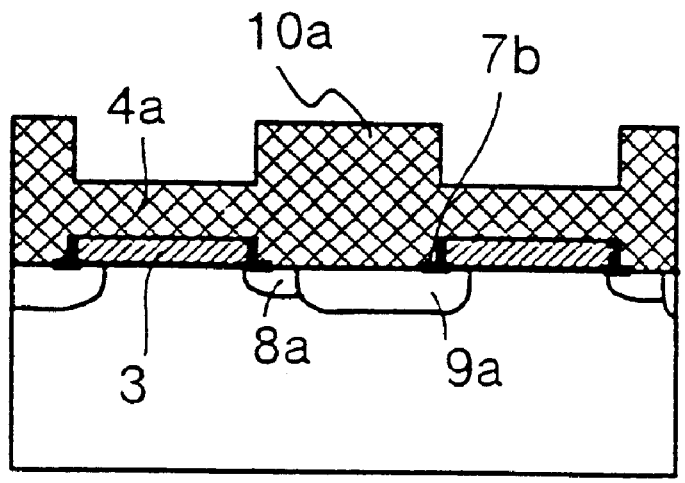
FIGS. 8(a) and 8(b) are schematic sectional views illustrating Example 7 of the process for manufacturing the semiconductor memory device according to the present invention.

Successively, a silicon oxide film 10 of about 400 to about 600 nm thick is deposited between the lower floating gates by HDP-CVD method to have substantially the same wet etching rate as the silicon oxide film 4a and the sidewall insulating film 7b. Then, as shown in FIG. 8(a), wet etching method using hydrofluoric acid is performed to expose the top surface of the silicon nitride film 5 and the silicon nitride film 5 is removed with heated phosphoric acid.

Figure 8B:
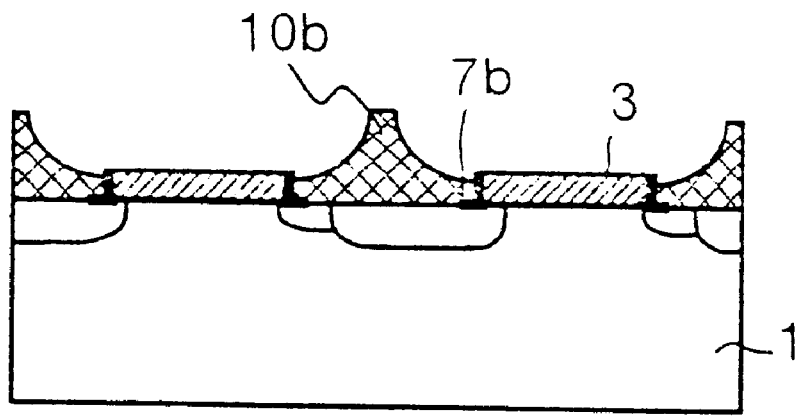

Further, as shown in FIG. 8(b), the buried insulating film 10a is etched into a round shape while removing the silicon oxide film 4 by wet etching method using diluted hydrofluoric acid.

Thereafter, a semiconductor memory device is completed in the same manner as in Example 1.

According to the above-mentioned process for manufacturing the semiconductor memory device, 1) the width of the round portion of the buried insulating film 10a can be formed greater by setting the etching rates of the buried insulating film 10a and the sidewall insulating film as substantially the same degree. According to this, the curvature of an upward convex of the buried insulating film becomes gentle, which makes the formation of the control gate on the round portion easier. Further, increasing the top area of the floating gate improves the coupling ratio through an interlayer capacitance film as well as the writing speed.

EXAMPLE 8

As shown in FIGS. 9(a) and 9(a'), a tunnel oxide film 2 made of a silicon oxide film of about 10 nm thick is formed on an active region of a p-type semiconductor substrate 1 by thermal oxidization, and a phosphorus doped polysilicon film 3 of about 50 nm thick as a material for a lower floating gate, a silicon oxide film 4 of about 50 to about 150 nm thick as an insulating film material formed by CVD method and a silicon nitride film 5 of about 200 nm as an insulating film are formed. Using a resist film R1 patterned by photolithography as a mask (not shown in FIGS. 9(a)–(a')), the silicon nitride film 5, the silicon oxide film 4, the polysilicon film 3 and the tunnel oxide film 2 are sequentially etched to form a lower floating gate. At this time, the silicon nitride film 5 and the silicon oxide film 4 are patterned into a tapered shape.

As shown in FIGS. 9(b) and 9(b'), the resist film R1 is removed and then an impurity layer 8 is formed by ion implantation in the same manner as shown in FIG. 2(b) using the lower floating gate as a mask. Then, as shown in FIGS. 9(c) and 9(c'), arsenic ions, for example, are implanted at about −15° to about −35°, about 5 to about 40 keV and about $1 \times 10^{15}$ to about $1 \times 10^{16}/cm^2$ to form an impurity layer 9. Thereafter, impurities are activated by heating.

Next, as shown in FIGS. 9(d) and 9(d'), a silicon oxide film 10 of about 400 to about 600 nm thick as an insulating film is deposited by HDP-CVD method. A top portion of the silicon oxide film 10 is removed by wet etching method using diluted hydrofluoric acid to fully expose the top surface of the patterned silicon nitride film 5 as shown in FIGS. 9(e) and 9(e'). At this time, a buried insulating film 10a is formed into an overhang shape.

Then, as shown in FIGS. 9(f) and 9(f'), the silicon nitride film 5 is removed by wet etching method using heated phosphoric acid. Then, the buried insulating film 10a is etched into a round shape while removing the silicon oxide film 4 by wet etching method using diluted hydrofluoric acid as shown in FIGS. 9(g) and 9(g'). The overhanging of the buried insulating film 10a can be completely removed by setting an etched amount of the buried insulating film 10a to an amount greater than the amount of the overhanging at the removal of the silicon oxide film 4. Thus, a buried insulating film 10b is filled in a space between the lower floating gates.

Next, as shown in FIGS. 9(h) and 9(h'), for increasing the gate coupling ratio, a phosphorus-doped polysilicon film 11 of about 100 nm thick is formed and polished by CMP method until the top surface of the buried insulating film 10b in the space between the lower floating gates is exposed as shown in FIGS. 9(i) and 9(i'). Thus a polysilicon film 11a as an upper floating gate is formed.

Then, as shown in FIGS. 9(j) and 9(j'), an ONO film 12 and a polycide film 13 are formed. Using a resist film R3 patterned by photolithography as a mask (not shown in FIGS. 9(j)–(j')), a control gate 13a and a floating gate comprising the upper floating gate 11b and the lower floating gate 3a are patterned by RIB method. Then, an impurity layer 14 for memory device isolation is formed using the control gate 13a as a mask.

Thereafter, interlayer insulating film, contact hole and metal wiring are formed by a known technique.

According to the above-mentioned process for manufacturing the semiconductor memory device, 1) the silicon oxide film 4 and the silicon nitride film 5 are patterned into a tapered shape. Thereby an upwardly projected buried insulating film having an inclined portion with a smaller curvature can be formed in a later step. Thus, the control gate can be easily formed on the inclined portion.

Further, 2) the tapered angle of the silicon oxide film 4 and the silicon nitride film 5 affects the curvature of the inclined portion of the buried insulating film formed in a later step. Therefore controlling the tapered angle enables the reduction of the width of the inclined portion of the buried insulating film by the amount corresponding to the offset of the tapered portion. Thus, the miniaturization of the floating gate can be easily realized.

EXAMPLE 9

In the same manner as Example 1, a tunnel oxide film 2, a polysilicon film 3, a silicon oxide film 4, a silicon nitride film 5, impurity layers 8 and 9 and a silicon oxide film 10 by HDP-CVD method are formed on an active region of a p-type semiconductor substrate 1. Then, as shown in FIG. 10(a), the top surface of the silicon nitride film 5 is exposed and polished by CMP method instead of wet etching method using diluted hydrofluoric acid.

Then, the silicon nitride film 5 is removed by wet etching method using heated phosphoric acid and a buried insulating film 10a is etched back into a round shape while removing the silicon oxide film 4 by wet etching method using diluted hydrofluoric acid as shown in FIG. 10(b).

Thereafter, a semiconductor memory device is completed in the same manner as in Example 1.

According to the above-mentioned process for manufacturing the semiconductor memory device, 1) the silicon nitride film 5 is used as a stopper for polishing the buried insulating film 10, so that the resulting buried insulating film 10a has the same flat plane as the silicon nitride film 5. In particular, even if a sidewall insulating film is formed on the sidewalls of the polysilicon film as a lower floating gate material, it is unnecessary to control the removal of the buried insulating film 10a so as not to expose the sidewall insulating film, which makes the manufacturing process simple and easy.

EXAMPLE 10

As shown in FIGS. 11(a) and 11(a'), a tunnel oxide film 2 made of a silicon oxide film of about 10 nm thick is formed on an active region of a p-type semiconductor substrate 1 by thermal oxidation, and a phosphorus-doped polysilicon film 3 of about 50 nm thick as a lower floating gate material, a silicon oxide film 4 of about 50 to about 150 nm thick as an insulating film material formed by CVD method and a silicon nitride film 5a of about 300 nm thick as an insulating film material are formed thereon. Using a resist film Ri patterned by photolithography as a mask (not shown in FIGS. 11(a) and (a')), the silicon nitride film 5, the silicon oxide film 4, the polysilicon film 3 and the tunnel oxide film 2 are etched sequentially to form a lower floating gate.

As shown in FIGS. 11(b) and 11(b'), the resist film R1 is removed and then a first impurity layer 8 is formed by ion implantation in the same manner as shown in FIG. 2(b) using the lower floating gate as a mask. Further, a second impurity layer 9 is formed by implanting arsenic ions at about −50 to about −35°, about 5 to about 40 keV and about $1 \times 10^{15}$ to about $1 \times 10^{16}/cm^2$ as shown FIGS. 11(c) and 11(c'). Then, impurities are activated by heating, forming layers 8a and 9a.

Next, as shown in FIGS. 11(d) and 11(d'), a silicon oxide film 10 of about 500 to about 700 nm thick as an insulating film material is deposited by HDP-CVD method. A top portion of the silicon oxide film 10 is removed by wet etching method using diluted hydrofluoric acid to fully expose the top surface of the patterned silicon nitride film 5 as shown in FIGS. 11(e) and 11(e'). At this time, level difference between the top surface of the silicon oxide film 4 and the top surface of the silicon oxide film 10a needs to be greater than the thickness of the silicon oxide film 10a to be reduced at the removal of the silicon oxide film 4 to be performed later.

Thereafter, as shown in FIGS. 11(f) and 11(f'), the silicon nitride film 5 is removed by wet etching using heated phosphoric acid. Then, as shown in FIGS. 11(g) and 11(g'), the buried insulating film 10a is etched back into a round shape while removing the silicon oxide film 4 by wet etching method using diluted hydrofluoric acid. As a result, upper side portions of a buried insulating film 10b are formed to be vertical to the surface of the semiconductor substrate.

Then, as shown in FIGS. 11(h) and 11(h'), for increasing the gate coupling ratio, a phosphorus-doped polysilicon film 11 of about 200 nm thick is formed and polished by CMP method until the buried insulating film 10b in a space between the lower floating gates is exposed so as to form a polysilicon film 11a as an upper floating gate material. Even if the polishing by CMP method is not accurate, an upper surface area of the polysilicon film 11a, i.e., an upper surface area to be covered with an ONO film, can be inhibited from varying by controlling the polished surface of the polysilicon film 11a to cross the vertical side portion of the buried insulating film 10b.

Further, as shown in FIGS. 11(j) and 11(j'), the buried insulating film 10b is etched back forming buried insulating film 10c using the polysilicon film 11a as a mask to expose the sidewalls of the polysilicon film 11a. The buried insulating film 10b needs to be etched back so that a round portion of the polysilicon film 11a is not exposed, i.e., almost vertical sidewalls of the polysilicon film 11a are only exposed.

Further, as shown in FIGS. 11(k) and 11(k'), an ONO film 12 and a polycide film are deposited. Using a resist film R3 patterned by photolithography as a mask (not shown in FIGS. 11(k)–(k')), a control gate 13a from the polyside film and a floating gate comprising the upper floating gate 11b and the lower floating gate 3a are formed by RIB method. Then, a third impurity layer 14 for memory device isolation is formed using the control gate 13a as a mask.

Then, interlayer insulating film, contact hole and metal wiring are formed by a known technique to complete a semiconductor memory device.

According to the above-mentioned process for manufacturing the semiconductor memory device, 1) the top portion of the buried insulating film 10b between the polysilicon films 11a is etched back to an extent such that the round portion of the polysilicon film 11a is not exposed. Thereby the surface area can be increased by the area of the exposed vertical sidewalls, and the coupling ratio through the interlayer capacitance film and the writing speed are improved.

EXAMPLE 11

Figure 12:
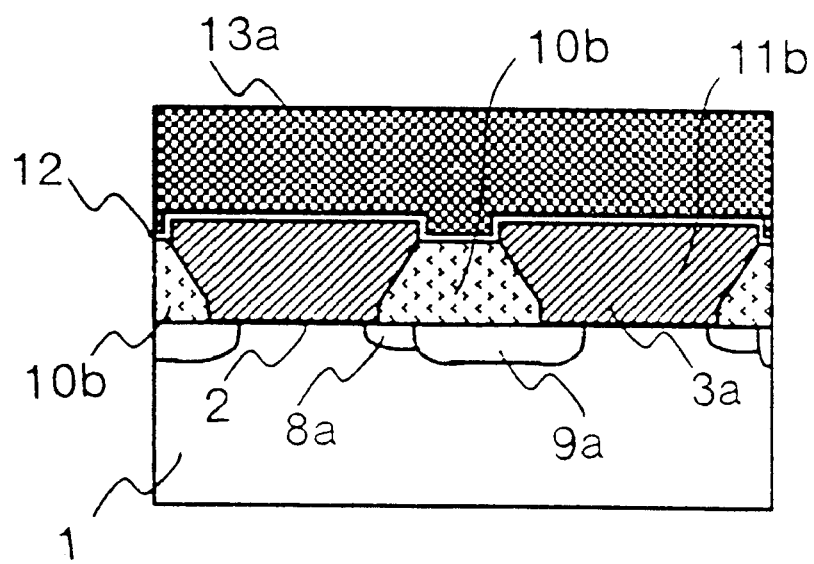
FIG. 12 is a schematic sectional view illustrating Example 11 of the process for manufacturing the semiconductor memory device according to the present invention.
Figure 13A:
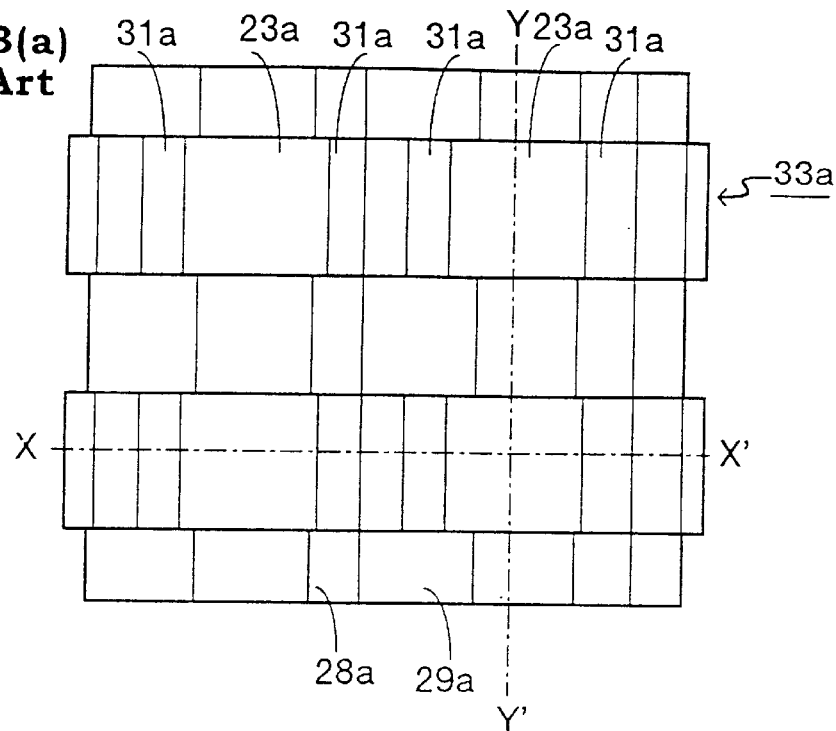
FIGS. 13(a) and 13(b) are schematic plan views illustrating the process for manufacturing a conventional semiconductor memory device.
Figure 13B:
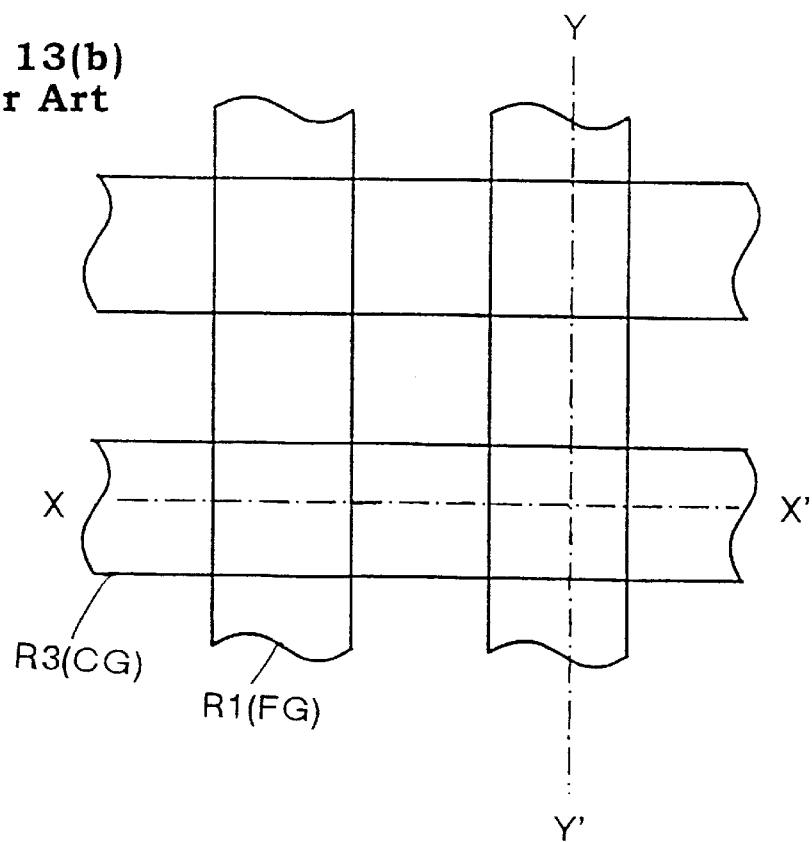
Figure 15:
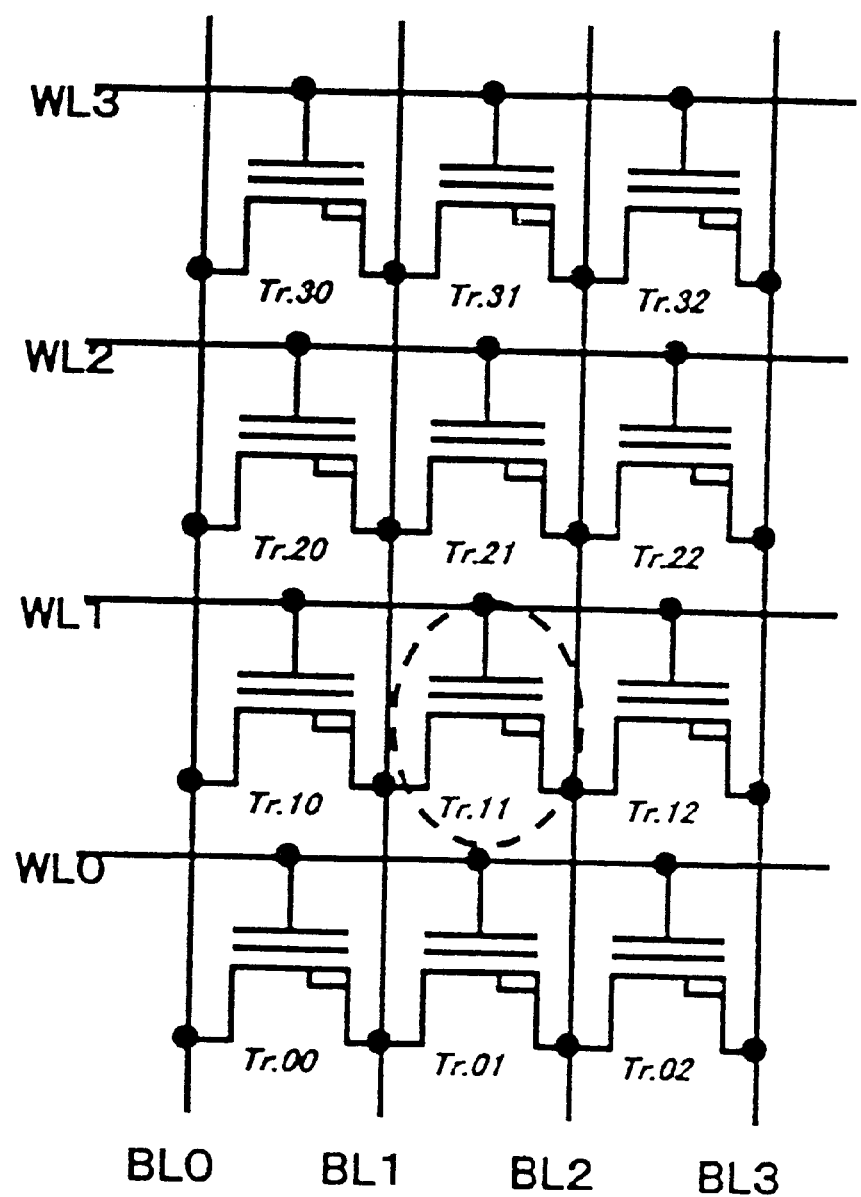
FIG. 15 is an equivalent circuit diagram illustrating an operation principle a conventional semiconductor memory device.
Figure 16:
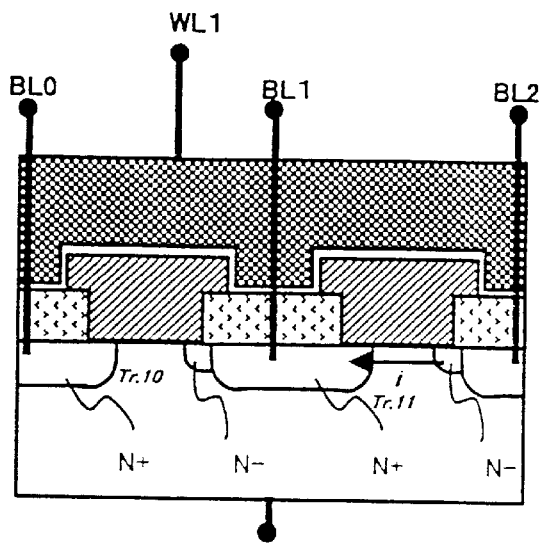
FIG. 16 is a perspective sectional view illustrating a reading principle of the conventional semiconductor memory device.
Figure 17:
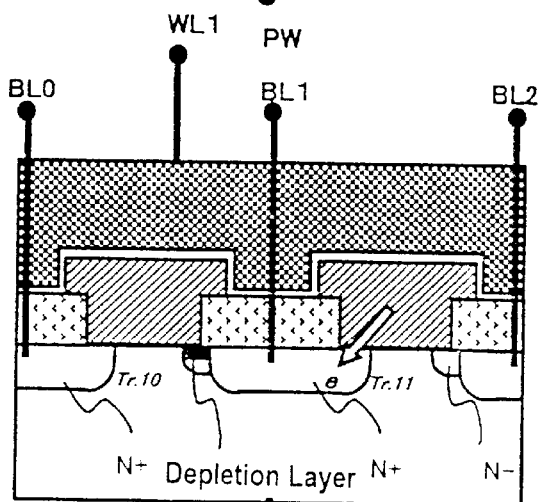
FIG. 17 is a perspective sectional view illustrating a writing principle of the conventional semiconductor memory device.
Figure 18:
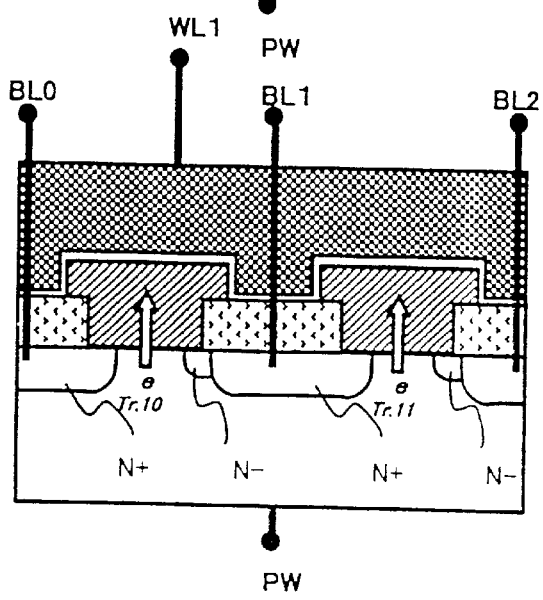
FIG. 18 is a perspective sectional view illustrating an erasing principle of the conventional semiconductor memory device.
Figure 19A:
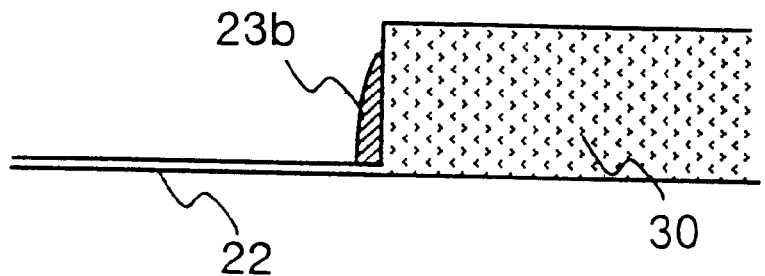
FIGS. 19(a) and 19(b) are schematic sectional views of major part illustrating drawbacks of the conventional process for manufacturing a conventional semiconductor memory device.
Figure 19B:
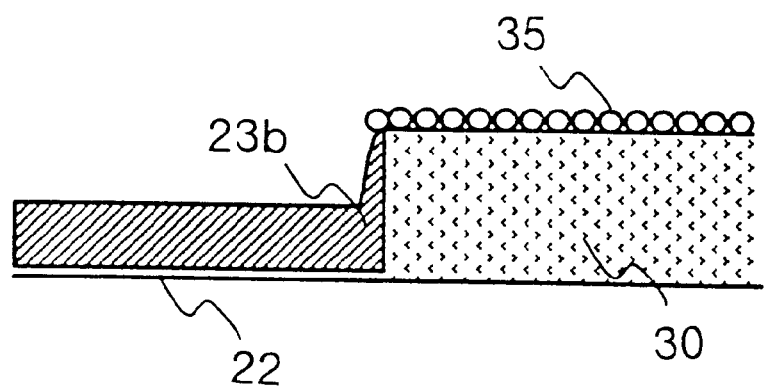

As shown in FIG. 12, in a semiconductor memory device of this example, a floating gate of a two-layer structure comprising a lower floating gate 3a and an upper floating gate 11b is formed on an active region of a p-type semiconductor substrate through the intervention of a tunnel oxide film 2, and a control gate 13a is formed on the floating gate film through the intervention of an ONO film 12 as a capacitance insulating film. The lower floating gate 3a has sidewalls which are substantially vertical with respect to the surface of the substrate. The upper floating gate 11b is formed on the lower floating gate 3a and has sidewalls which are an almost reverse-tapered shape.

A buried insulating film 10b of an almost tapered shape, which corresponds to the shape of the floating gate, is arranged in a space between the floating gates.

Further, impurity layers 8a and 9a which are asymmetric with each other are formed at both sides of the lower floating gate 3a to cross the control gate 13a, respectively.

The height of the buried insulating film 10b in accordance with the shape of the lower floating gate 3a is determined such that the lower floating gate 3a is not remained after the etching of the control gate 13a, the ONO film 12 and the floating gate.

The semiconductor memory device as described above is constituted of two conductive materials which are layered and electrically connected. The buried insulating film contacting the sidewalls of the polysilicon film as the lower floating gate is formed so thin that the polysilicon film does not remain when the control gate is formed. Therefore the control gate can be formed easily and failure of the memory device can be avoided.

Further, the buried insulating film is formed to have a portion tapered toward the top surface thereof and a vertical sidewall portion adjacent to the lower floating gate. At least on the sidewalls of the tapered portion a polysilicon film as an upper floating gate material is formed in self-alignment, therefore the buried insulating film can ensure the thickness enough to bear the formation (patterning) of the control gate.

Moreover, at the tapered portion of the buried insulating film, the polysilicon film is patterned into the upper floating gate while removing a reaction product generated during the etching, therefore the etching is performed without any failure.

According to the process for manufacturing a semiconductor memory device of the present invention, a distance between the floating gates can be reduced, which increases the number of bit lines per unit area and reduces a cell area. Polishing the upper surface of the floating gate enables the formation of a thin interlayer capacitance film and writing speed is improved. Further, the thickness of an insulating film at the sidewalls of the floating gate can be controlled with more accuracy, therefore improved characteristics of maintaining electric charges and disturbance characteristics can be obtained. Thus, a highly reliable semiconductor memory device can be fabricated.

What is claimed is:

1. A process for manufacturing a semiconductor memory device comprising the steps of:
    (a) forming a tunnel oxide film, a first conductive film to be a lower floating gate, a first insulating film and a second insulating film in this order on a semiconductor substrate and patterning the second insulating film, the first insulating film, the first conductive film and the tunnel oxide film into a desired configuration;
    (b) forming a third insulating film on the entire surface of the resulting semiconductor substrate;
    (c) reducing the third insulating film until the second insulating film is exposed;
    (d) removing the second insulating film;
    (e) removing the first insulating film while further reducing the third insulating film;
    (f) forming a second conductive film to be an upper floating gate on the first conductive film and the third insulating film;
    (g) flattening the second conductive film until the third insulating film is exposed; and
    (h) forming an interlayer capacitance film and a third conductive film to be a control gate on the second conductive film and the third insulating film, and patterning the third conductive film, the interlayer capacitance film, the second conductive film and the first conductive film to form a floating gate and the control gate.

2. A process according to claim 1, wherein etching rates of the third insulating film and the first insulating film are substantially the same.

3. A process according to claim 1, wherein a sidewall insulating film is formed on sidewalls of the patterned first conductive film, the sidewall insulating film having substantially the same etching rate as that of the first insulating film.

4. A process according to claim 1, wherein sidewalls of the patterned first conductive film are thermally oxidized to form a oxide film on sidewalls of the patterned first conductive film.

5. A process according to claim 1, wherein a sidewall insulating film is formed on sidewalls of the first conductive film after thermally oxidizing the patterned first conductive film.

6. A process according to claim 5, wherein the sidewall insulating film is densified by thermal treatment to set the etching rate thereof as substantially the same as that of the first insulating film.

7. A process according to claim 6, wherein etching rates of the third and first insulating films are substantially the same.

8. A process according to claim 1, wherein the first and second insulating films are patterned into a tapered shape in the step (a).

9. A process according to claim 1, wherein the reduction of the third insulating film is performed by etching or polishing in the step (c).

10. A process according to claim 1, wherein the second conductive film is flattened until the third insulating film is exposed and then the third insulating film is reduced to partially expose sidewalls of the second conductive film in the step (g).

11. A process for manufacturing a semiconductor memory device, the process comprising:
    (a) forming a tunnel oxide film, a first conductive film to be a lower floating gate, a first insulating film and a second insulating film in this order so as to be supported by a semiconductor substrate, and patterning the second insulating film, the first insulating film, the first conductive film and the tunnel oxide film into a desired configuration;
    (b) after step (a), forming a third insulating film on the resulting semiconductor substrate;
    (c) reducing the third insulating film until the second insulating film is at least partially exposed;
    (d) removing the second insulating film;
    (e) removing the first insulating film and further reducing the third insulating film;
    (f) after step (e), forming a second conductive film to be an upper floating gate on the first conductive film and the third insulating film;
    (g) flattening the second conductive film until the third insulating film is at least partially exposed; and
    (h) forming an interlayer capacitance film and a third conductive film to be a control gate on the second conductive film and the third insulating film, and patterning the third conductive film, the interlayer capacitance film, the second conductive film and the first conductive film to form a floating gate and the control gate.

* * * * *